United States Patent
Lin et al.

(10) Patent No.: US 11,824,102 B2
(45) Date of Patent: *Nov. 21, 2023

(54) OPTIMIZED PROXIMITY PROFILE FOR STRAINED SOURCE/DRAIN FEATURE AND METHOD OF FABRICATING THEREOF

(71) Applicant: Taiwan Semiconductor Manufacturing Co., Ltd., Hsin-Chu (TW)

(72) Inventors: Chun-An Lin, Tainan (TW); Kuo-Pi Tseng, Hsinchu (TW); Tzu-Chieh Su, Hsinchu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/978,576

(22) Filed: Nov. 1, 2022

(65) Prior Publication Data

US 2023/0050300 A1 Feb. 16, 2023

Related U.S. Application Data

(63) Continuation of application No. 16/867,949, filed on May 6, 2020, now Pat. No. 11,489,062.
(Continued)

(51) Int. Cl.
*H01L 29/66* (2006.01)
*H01L 29/78* (2006.01)
(Continued)

(52) U.S. Cl.
CPC .... *H01L 29/66636* (2013.01); *H01L 21/3065* (2013.01); *H01L 29/0847* (2013.01);
(Continued)

(58) Field of Classification Search
CPC .......... H01L 21/3065; H01L 21/30608; H01L 21/823431; H01L 21/823821;
(Continued)

(56) References Cited

U.S. PATENT DOCUMENTS 7,732,285 B2   6/2010   Sell et al.
8,642,417 B2   2/2014   Cheng et al.
(Continued)

FOREIGN PATENT DOCUMENTS

KR   20150058888      5/2015
KR   20150072333 A    6/2015
(Continued)

*Primary Examiner* — David C Spalla
(74) *Attorney, Agent, or Firm* — HAYNES AND BOONE, LLP

(57) ABSTRACT

Source and drain formation techniques disclosed herein provide FinFETs with reduced channel resistance and reduced drain-induced barrier lowering. An exemplary three-step etch method for forming a source/drain recess in a source/drain region of a fin includes a first anisotropic etch, an isotropic etch, and a second anisotropic etch. The first anisotropic etch and the isotropic etch are tuned to define a location of a source/drain tip. A depth of the source/drain recess after the first anisotropic etch and the isotropic etch is less than a target depth. The second anisotropic etch is tuned to extend the depth of the source/drain recess to the target depth. The source/drain tip is near a top of the fin to reduce channel resistance while a bottom portion of the source/drain recess is spaced a distance from a gate footing that can minimize DIBL. The source/drain recess is filled with an epitaxial semiconductor material.

20 Claims, 12 Drawing Sheets

Related U.S. Application Data

(60) Provisional application No. 62/855,079, filed on May 31, 2019.

(51) Int. Cl.
  *H01L 29/08* (2006.01)
  *H01L 21/3065* (2006.01)
  *H01L 29/417* (2006.01)

(52) U.S. Cl.
  CPC .. *H01L 29/41791* (2013.01); *H01L 29/66795* (2013.01); *H01L 29/7848* (2013.01); *H01L 29/7851* (2013.01)

(58) Field of Classification Search
  CPC ............... H01L 21/845; H01L 27/0886; H01L 27/0924; H01L 27/1211; H01L 29/0843; H01L 29/0847; H01L 29/41791; H01L 29/66636; H01L 29/66795; H01L 29/7848; H01L 29/785; H01L 29/7851; H01L 29/7853; H01L 29/7855; H01L 2029/7858
  See application file for complete search history.

(56) References Cited

U.S. PATENT DOCUMENTS

| | | | |
|---|---|---|---|
| 9,142,672 | B2 | 9/2015 | Chang et al. |
| 9,716,165 | B1 | 7/2017 | Lin et al. |
| 11,489,062 | B2 * | 11/2022 | Lin ..................... H01L 21/3065 |
| 11,545,560 | B2 * | 1/2023 | Chuang ............. H01L 29/66636 |
| 2014/0367751 | A1 | 12/2014 | Yu et al. |
| 2015/0140759 | A1 | 5/2015 | Jeong et al. |
| 2015/0372143 | A1 | 12/2015 | Bae et al. |
| 2016/0056261 | A1 | 2/2016 | Thees et al. |
| 2016/0233164 | A1 | 8/2016 | Choi et al. |
| 2016/0260820 | A1 * | 9/2016 | Li ................... H01L 21/823431 |
| 2017/0278972 | A1 * | 9/2017 | Hsia ...................... H01L 29/785 |
| 2017/0338327 | A1 * | 11/2017 | Liu ..................... H01L 29/6656 |
| 2019/0115259 | A1 * | 4/2019 | Yeh .................. H01L 21/823425 |
| 2019/0115428 | A1 | 4/2019 | Tsai et al. |
| 2019/0131433 | A1 * | 5/2019 | Vinslava ................ H01L 21/845 |

FOREIGN PATENT DOCUMENTS

| | | |
|---|---|---|
| KR | 20190055677 A | 5/2019 |
| TW | 201533803 A | 9/2015 |
| TW | 201727908 A | 8/2017 |
| TW | 201916263 A | 4/2019 |

* cited by examiner

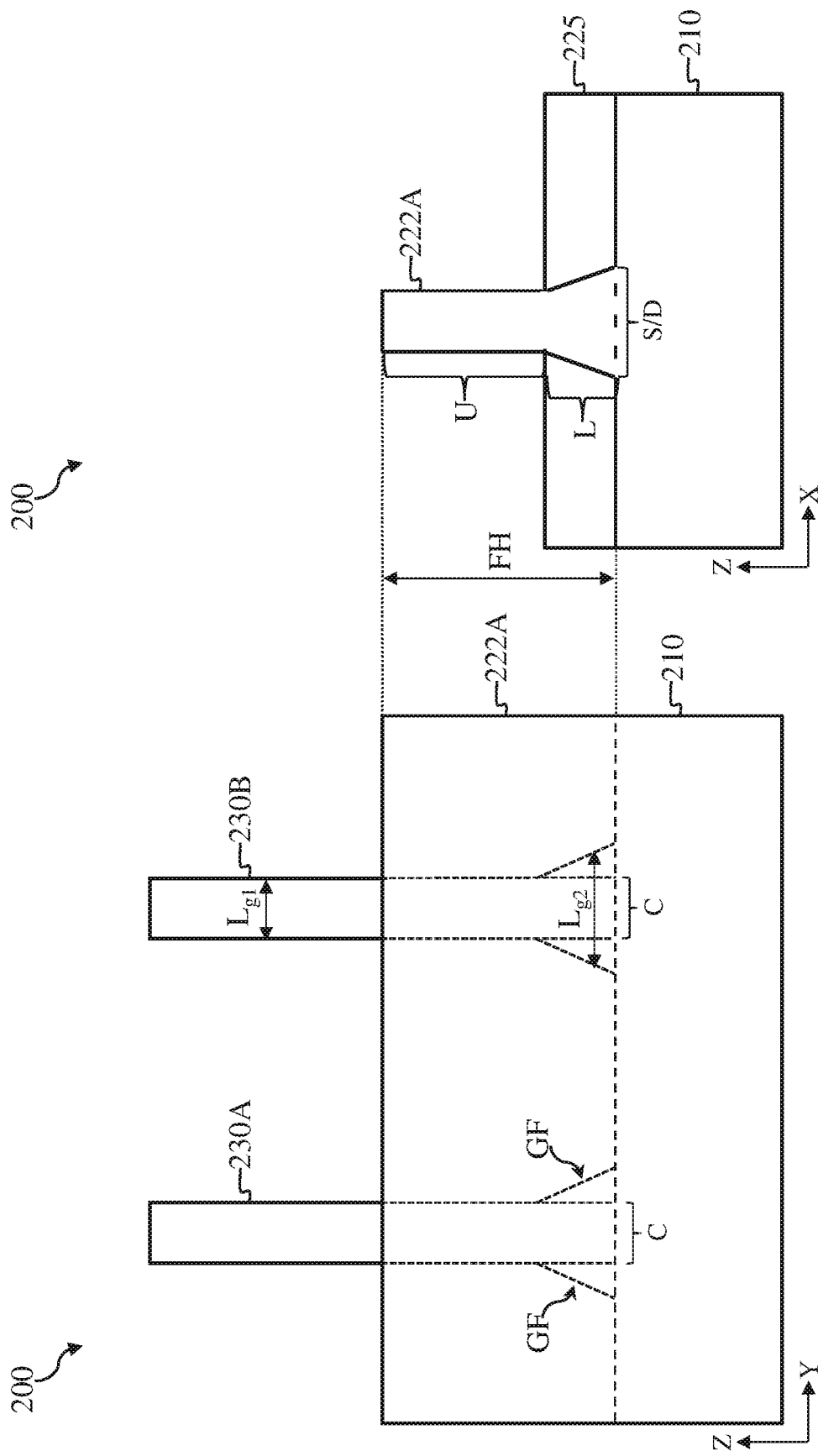

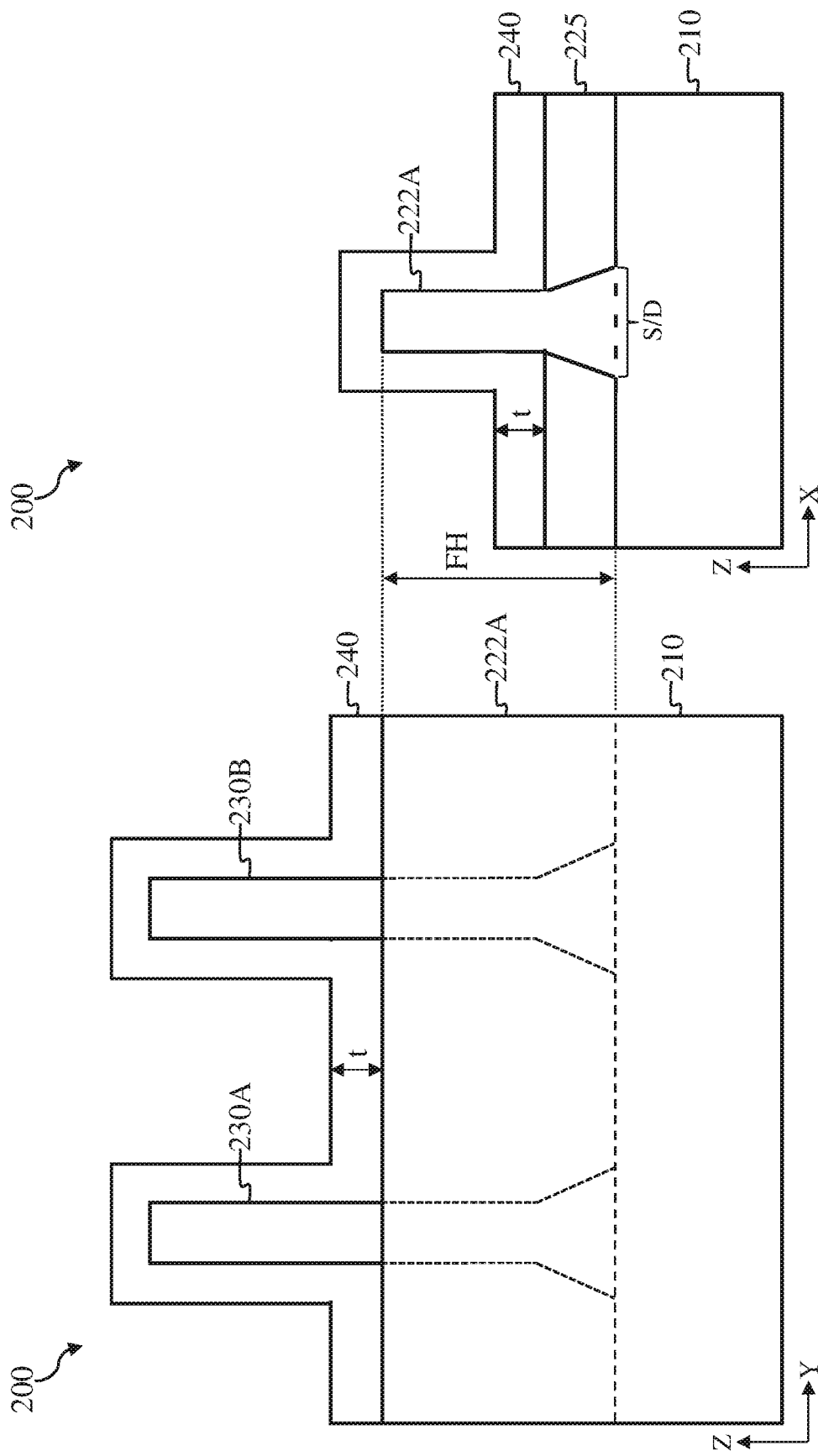

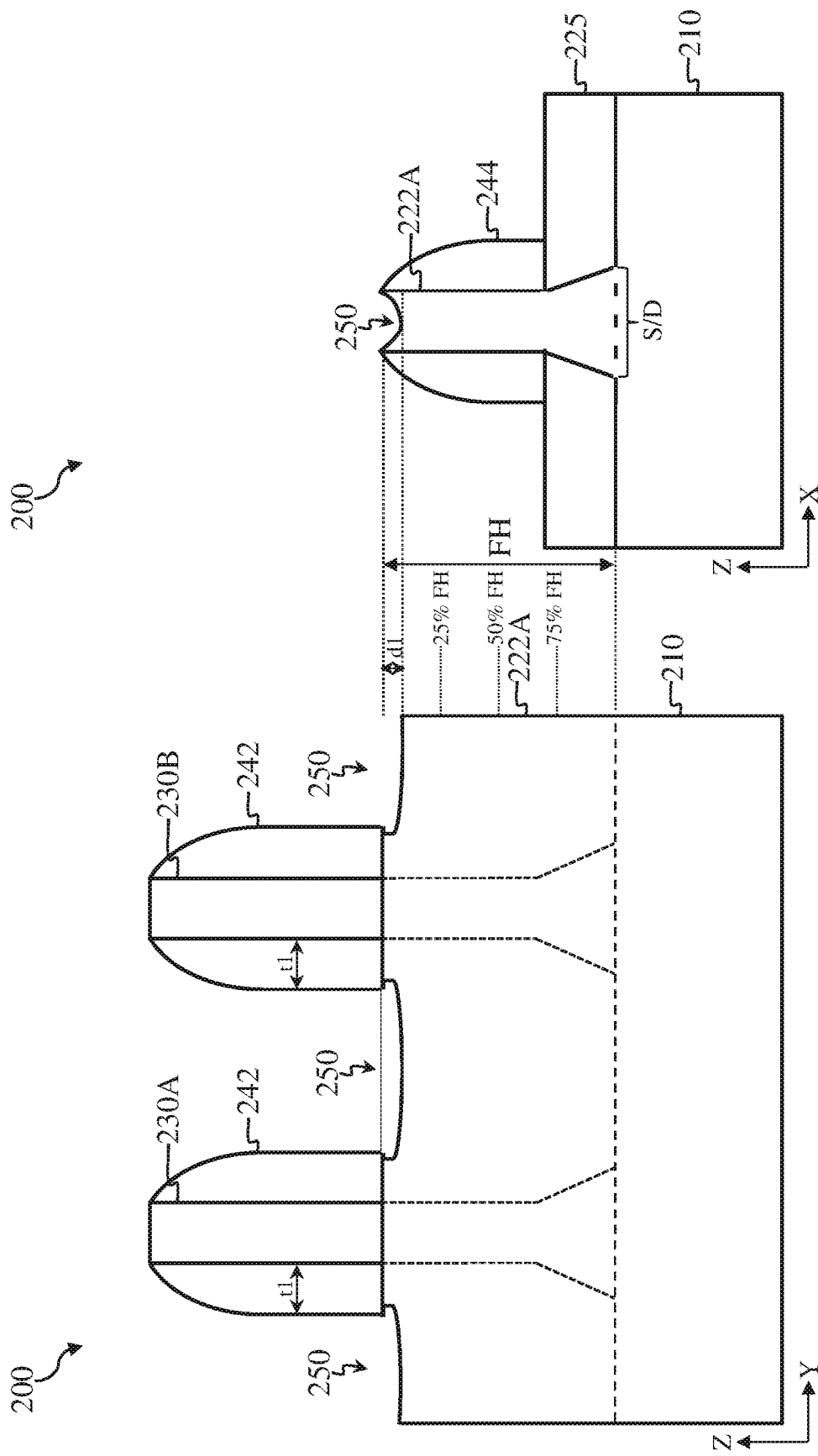

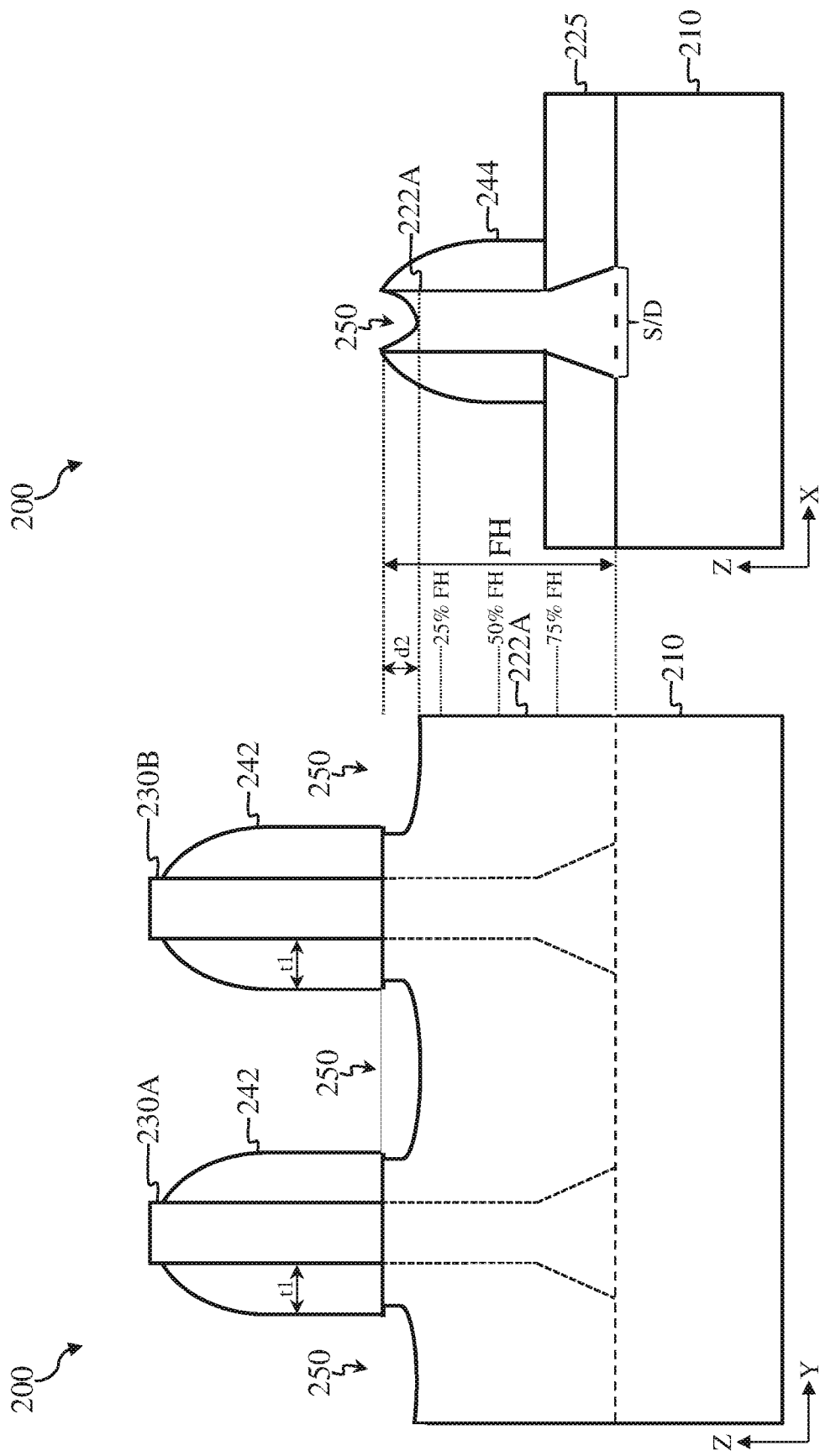

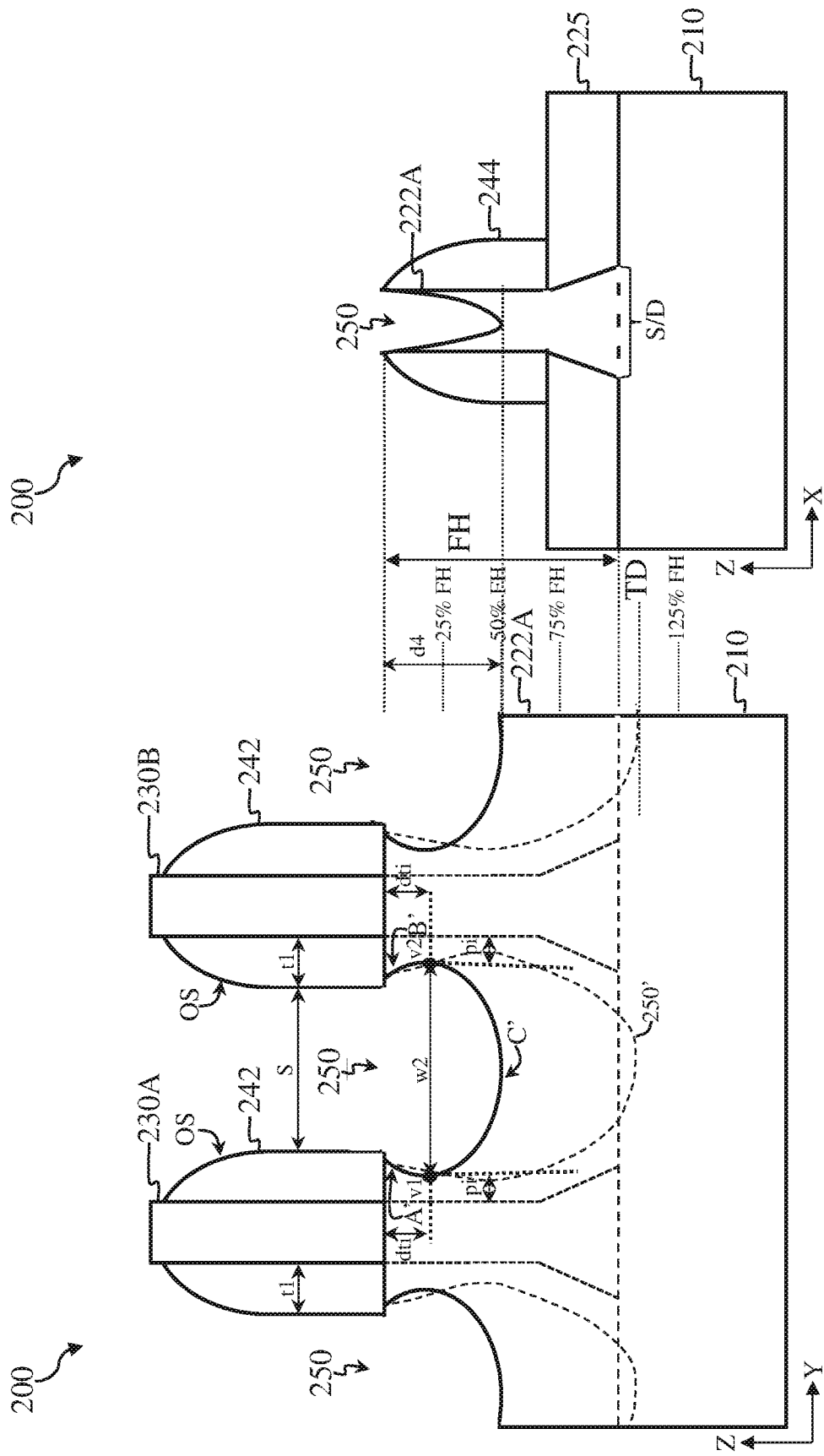

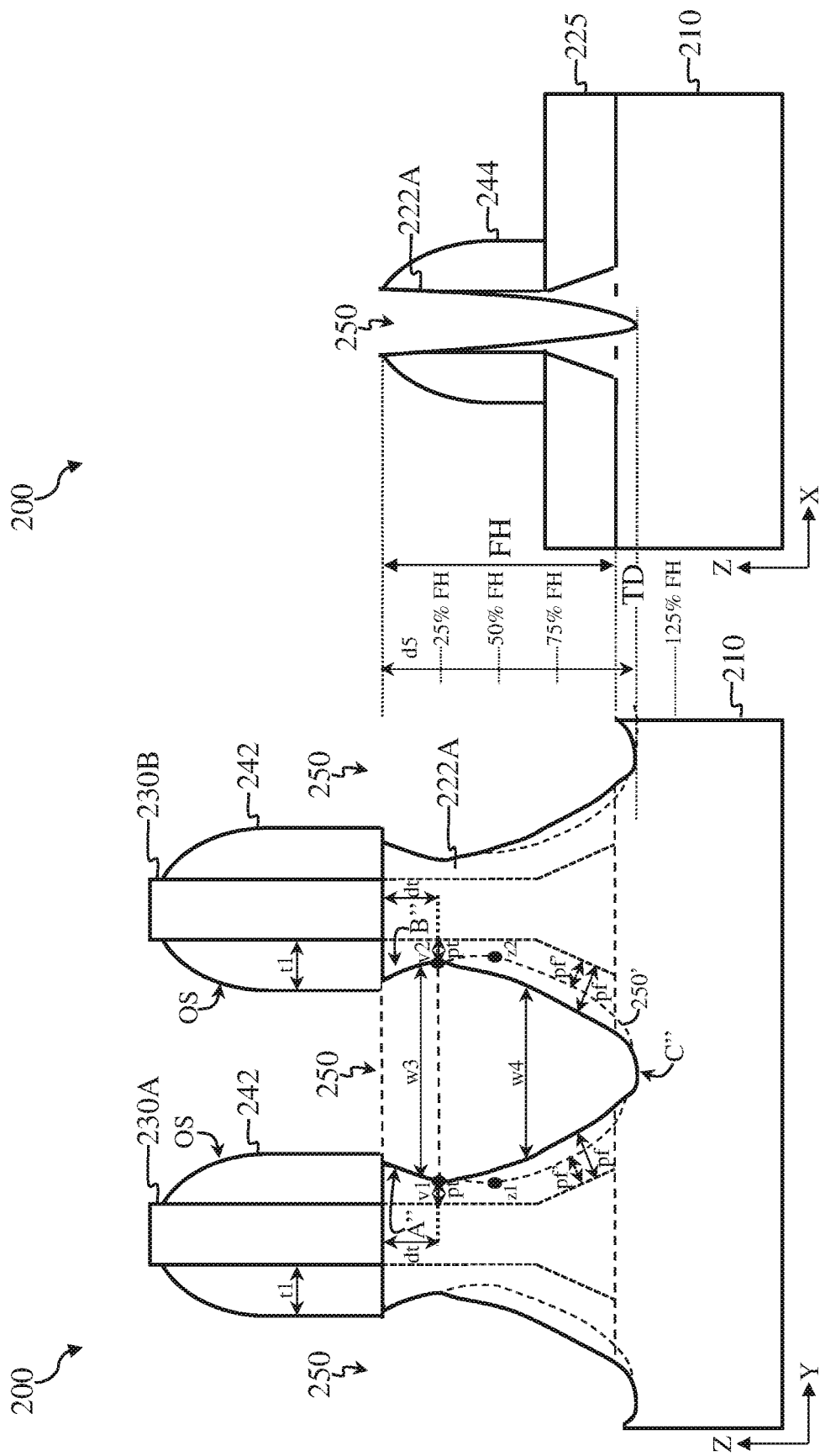

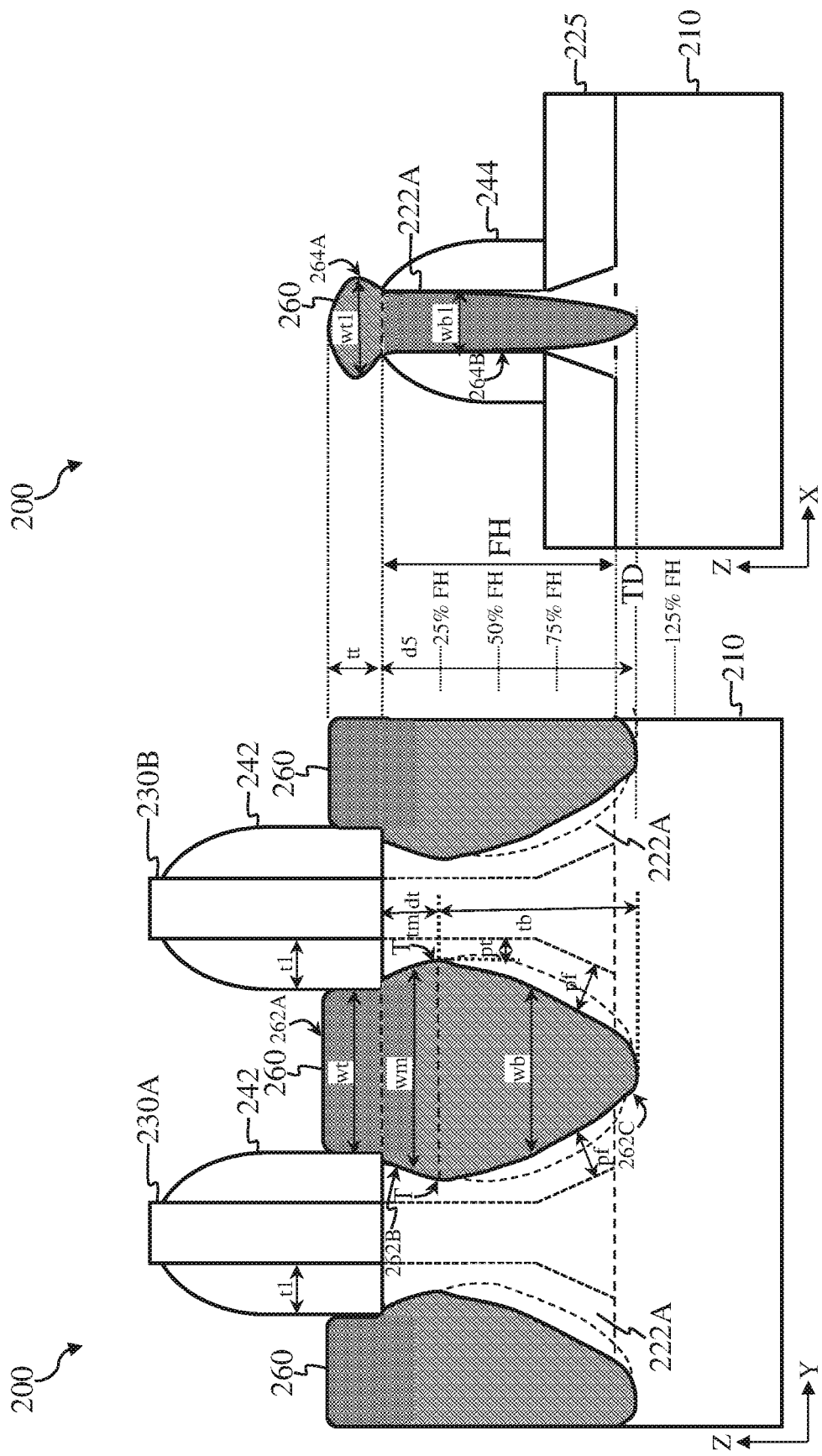

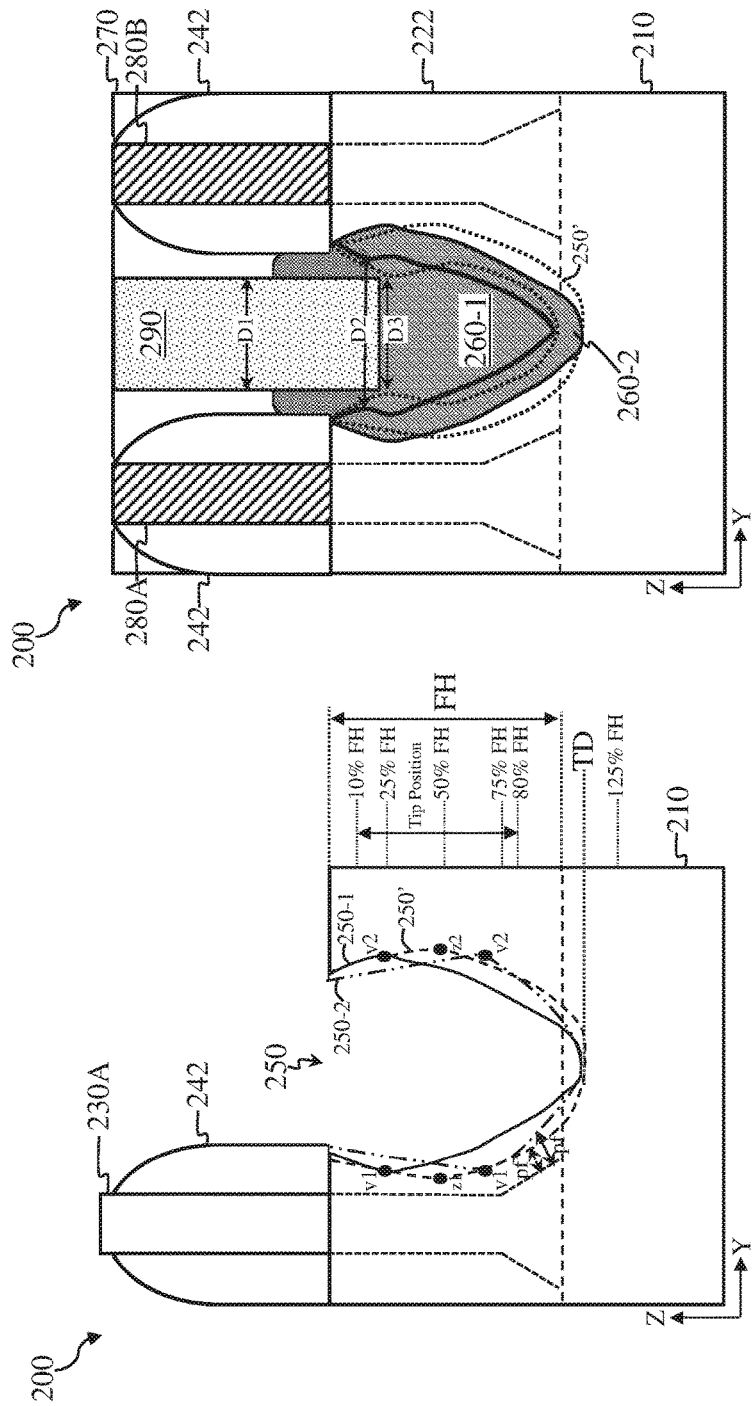
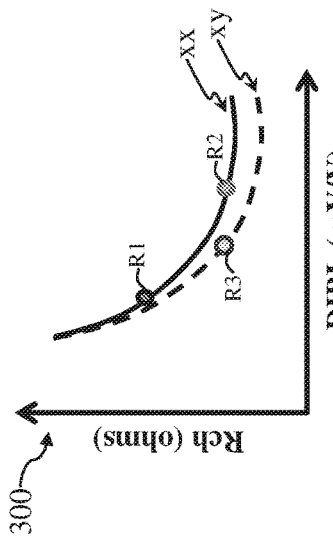
FIG. 5
FIG. 6
FIG. 7

OPTIMIZED PROXIMITY PROFILE FOR STRAINED SOURCE/DRAIN FEATURE AND METHOD OF FABRICATING THEREOF

This application is a continuation application of U.S. patent application Ser. No. 16/867,949, filed May 6, 2020, which is a non-provisional application of and claims benefit of U.S. Provisional Patent Application Ser. No. 62/855,079, filed May 31, 2019, the entire disclosures of which are incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as fin-like field effect transistor (FinFET) technologies progress towards smaller feature sizes (such as 32 nanometers, 28 nanometers, 20 nanometers, and below), advanced techniques are needed for precisely controlling profiles and/or dimensions of source/drain features to ensure and optimize FinFET device reliability. Although existing FinFET source/drain formation techniques have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-3I are fragmentary cross-sectional views of the FinFET device of FIG. 2 in a Y-Z plane along lines 1-1' at various source/drain feature fabrication stages, such as those associated with the method of FIG. 1, according to various aspects of the present disclosure.

FIGS. 4A-4I are fragmentary cross-sectional views of the FinFET device of FIG. 2 in an X-Z plane along lines 2-2' at various source/drain feature fabrication stages, such as those associated with the method of FIG. 1, according to various aspects of the present disclosure.

FIG. 5 illustrates how various source/drain feature fabrication stages can be tuned, such as those associated with the method of FIG. 1, to achieve desired profiles for source/drain features according to various aspects of the present disclosure.

FIG. 6 is a graph that illustrates channel resistance characteristics and drain-induced barrier lowering characteristics of FinFET devices having epitaxial source/drain features with different profiles according to various aspects of the present disclosure.

FIG. 7 is a fragmentary cross-sectional view of the FinFET device of FIG. 2 in a Y-Z plane along lines 1-1' at a source/drain feature fabrication stage similar to that of FIG. 3I and FIG. 4I according to various aspects of the present disclosure.

DETAILED DESCRIPTION

Figure 1:
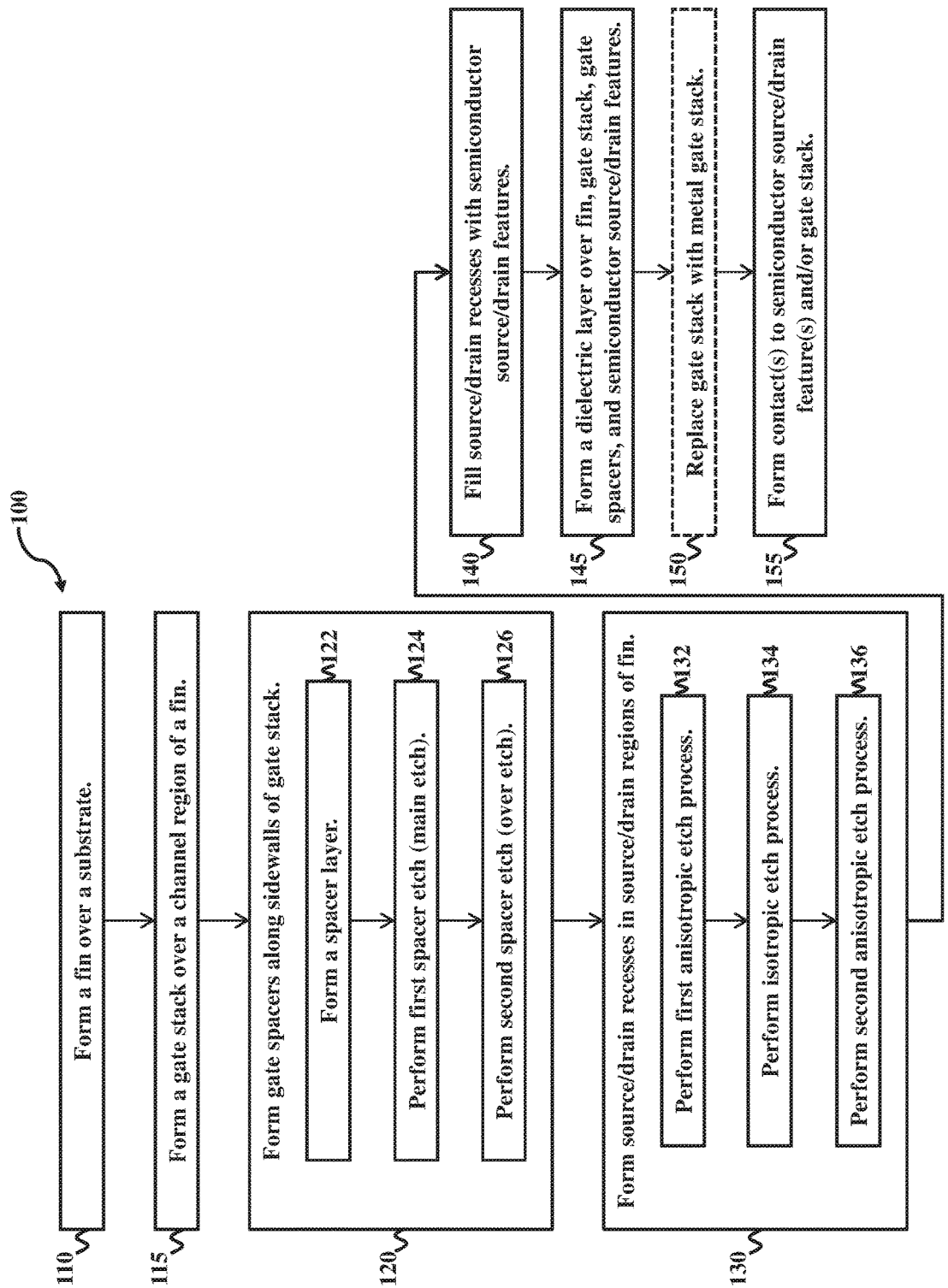
FIG. 1 is a flow chart of a method for fabricating a fin-like field effect transistor (FinFET) device according to various aspects of the present disclosure.

The present disclosure relates generally to integrated circuit devices, and more particularly, to fin-like field effect transistors (FinFETs).

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing. For example, the number or range of numbers encompasses numbers within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

For advanced IC technology nodes, FinFETs (also referred to as non-planar transistors) have become a popular and promising candidate for high performance and low leakage applications. As FinFETs are scaled down through various technology nodes, strained source/drain features (also referred to as stressor regions or raised source/drain features) have been formed from epitaxial semiconductor materials to enhance carrier mobility and improve device performance. Forming strained source/drain features typically includes etching recesses in source/drain regions of a fin and filling the recesses with epitaxial semiconductor material. For example, silicon may be epitaxially grown in the source/drain recesses to form strained source/drain features for an n-type FinFET and silicon germanium may be epitaxially grown in the source/drain recesses to form strained source/drain features for a p-type FinFET.

Various techniques directed at shapes, configurations, and materials of strained source/drain features can be implemented to further improve FinFET performance. For example, a proximity between a strained source/drain feature and a channel region of a fin (defined, for example, in the fin under a gate stack) has been observed to impact FinFET operation. Conventional methods for fabricating strained source/drain features thus tend to focus on configuring a tip of the strained source/drain feature as close as possible to the channel region of the fin to reduce resistance between the strained source/drain feature and the channel region and increase mobility of carriers within the channel region, thereby improving FinFET operation. However, it has been observed that profiles of strained source/drain features fabricated by these conventional methods often increase drain-induced barrier lowering (DIBL), impeding short channel control. In some instances, the worsening DIBL has been observed to negate any operation improvements achieved by the reduced resistance.

To overcome such challenges, the present disclosure recognizes that a depth of the tip of the strained source/drain feature (in other words, a location of the tip relative to a top surface of the fin) and a proximity of a bottom portion of the strained source/drain feature also impact FinFET operation. For example, the present disclosure proposes methods for fabricating strained source/drain features that control a location of a tip of a strained source/drain feature, such that the tip is in a top portion of a fin (for example, a distance between a top surface of the fin and the tip is equal to about 10% of a fin height to about 50% of a fin height). The proposed methods further increase a distance between a gate stack and a bottom portion of the strained source/drain feature, compared to a conventional strained source/drain feature, such that a capacitance is reduced between the gate stack and the strained source/drain feature. In some implementations, the proposed strained source/drain features have a candle light bulb-shaped cross-section. The proposed strained source/drain features are achieved by performing a three-step etching process, which includes a first anisotropic etch, an isotropic etch, and a second anisotropic etch. Such three-step etching process allows for precise control of a location of the tip of the strained source/drain feature (in particular, a depth of the tip in the fin and a distance between the tip and the channel region of the fin) and a distance between a bottom portion of the strained source/drain feature and the channel region and/or the gate stack. The disclosed profile of the strained source/drain feature can reduce resistance and reduce DIBL, thereby providing a FinFET with improved operation and short channel control. Details of the proposed methods for fabricating strained source/drain features and the proposed profiles for strained source/drain features are described herein in the following description.

FIG. 1 is a flow chart of a method 100 for fabricating an integrated circuit device according to various aspects of the present disclosure. In the present embodiment, method 100 fabricates an integrated circuit device that includes a FinFET device. At block 110 and block 115, a fin is formed over a substrate and a gate stack is formed over a channel region of the fin, respectively. The channel region of the fin is disposed between a source region of the fin and a drain region of the fin (collectively referred to as source/drain regions). At block 120, gate spacers are formed along sidewalls of the gate stack. Block 120 can include block 122, block 124, and block 126. For example, forming gate spacers can include forming a spacer layer over the gate stack and the fin at block 122, performing a first spacer etch at block 124 (for example, a main spacer etch), and performing a second spacer etch at block 126 (for example, a spacer over etch). In some embodiments, fin spacers are formed along sidewalls of the source/drain regions of the fin. The fin spacers may be formed simultaneously with the gate spacers. At block 130, method 100 proceeds with forming source/drain recesses in source/drain regions of the fin. Profiles of the source/drain recesses optimize FinFET performance, as described in detail herein. Block 130 includes block 132, block 134, and block 136. For example, forming the source/drain recesses includes performing a first anisotropic etch process at block 132, performing an isotropic etch process at block 134, and performing a second anisotropic etch process at block 136. A depth of the source/drain recesses after the first anisotropic etch process and a depth of the source/drain recesses after the isotropic etch process are less than a target depth for the source/drain recesses. Parameters of the first anisotropic etch process and the isotropic etch process are tuned to define a location of tips of the source/drain recesses, such as tip depth and tip proximity, that minimize parasitic resistance between source/drain features and a metal gate of the FinFET device. Parameters of the second anisotropic etch process are tuned to extend the source/drain recesses to the target depth. Defining the location of the source/drain tips before extending the source/drain recesses to the target depth results in a bottom portion of the source/drain recesses pulling back from the metal gate during the second anisotropic etch process, increasing distance between any gate footing and the source/drain recesses, which improves short channel control. In some embodiments, formation of the source/drain recesses may begin with formation of gate spacers at block 130, as described below.

The method 100 then proceeds to block 140 where the source/drain recesses are filled with a semiconductor material, thereby forming semiconductor source/drain features. At block 145, a dielectric layer is formed over the fin, the gate stack, the gate spacers, and the semiconductor source/drain features. At block 150, where method 100 includes a gate last process, a gate replacement process is performed to replace the gate stack (for example, a polysilicon dummy gate) with a metal gate stack, which can include a gate electrode disposed over a gate dielectric (e.g., a high-k dielectric layer). Alternatively, in some embodiments, method 100 includes a gate first process, where the gate stack formed at block 115 is a metal gate stack, such that method 100 may omit block 150. In yet another alternative, method 100 includes a hybrid gate first, gate last process, which may involve forming portions of the metal gate stack at block 115, block 150, and/or other stage of method 100. At block 155, method 100 proceeds with forming contacts to the semiconductor source/drain features and/or the metal gate stack. Processing may proceed with completing fabrication of the FinFET device. Additional steps can be provided before, during, and after method 100, and some of the steps described can be moved, replaced, or eliminated for additional embodiments of method 100.

Figure 2:
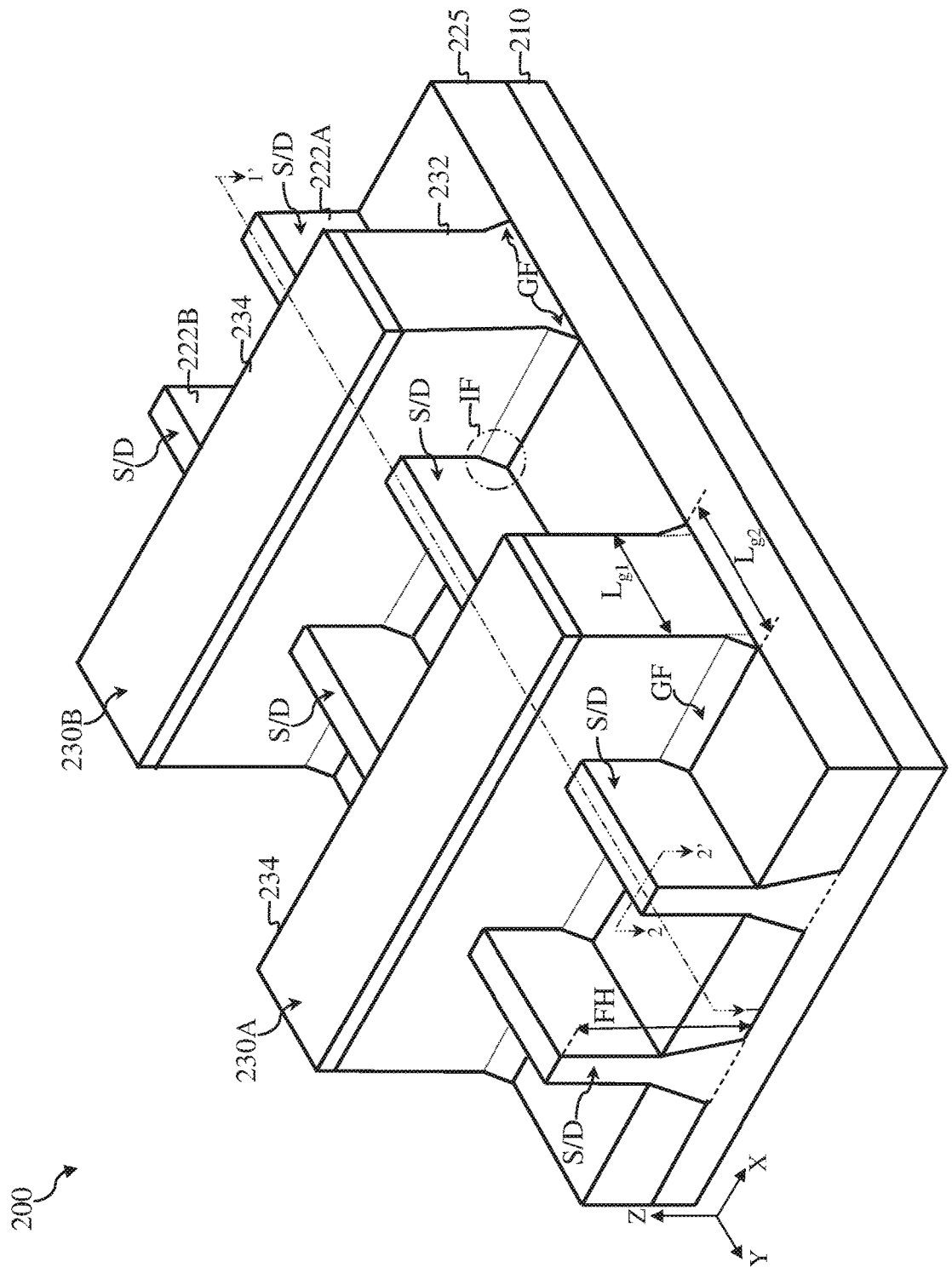
FIG. 2 is a perspective view of a FinFET device having source/drain regions, in portion or entirety, according to various aspects of the present disclosure.

FIG. 2 is a perspective view of a FinFET device 200, in portion or entirety, according to various aspects of the present disclosure. FIGS. 3A-3I are fragmentary cross-sectional views of FinFET device 200 in a Y-Z plane along lines 1-1' at various fabrication stages (such as those associated with method 100) according to various aspects of the present disclosure. FIGS. 4A-4I are fragmentary cross-sectional views of FinFET device 200 in an X-Z plane along lines 2-1' at various fabrication stages (such as those associated with method 100) according to various aspects of the present disclosure. FinFET device 200 may be included in a microprocessor, a memory, and/or other IC device. In some embodiments, FinFET device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. FIG. 2, FIGS. 3A-3I, and FIGS. 4A-4I have been simplified for the sake of clarity to better understand the inventive concepts of the present disclosure. Additional features can be added in FinFET device 200, and some of the features described below can be replaced, modified, or eliminated in other embodiments of FinFET device 200.

In FIG. 2, FIG. 3A, and FIG. 4A, FinFET device 200 includes a substrate (wafer) 210. In the depicted embodiment, substrate 210 includes silicon. Alternatively or additionally, substrate 210 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 210 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 210 can include various doped regions depending on design requirements of FinFET device 200. For example, substrate 210 can include a p-type doped region (referred to as a p-well), which can be configured for an n-type FinFET, and an n-type doped region (referred to as an n-well), which can be configured for a p-type FinFET. N-type doped regions are doped with n-type dopants, such as phosphorus, arsenic, other n-type dopant, or combinations thereof. P-type doped regions are doped with p-type dopants, such as boron, indium, other p-type dopant, or combinations thereof. In some embodiments, substrate 210 includes doped regions formed with a combination of p-type dopants and n-type dopants. The various doped regions can be formed directly on and/or in substrate 210, for example, providing a p-well structure, an n-well structure, a dual-well structure, a raised structure, or combinations thereof. An ion implantation process, a diffusion process, and/or other suitable doping process can be performed to form the various doped regions of FinFET device 200.

A fin structure 220 is formed over substrate 210. In FIG. 2, fin structure 220 includes multiple fins, such as a fin 222A and a fin 222B, extending from substrate 210. The present disclosure contemplates embodiments where fin structure 220 includes more fins or a single fin extending from substrate 210. Fins 222A, 222B extend substantially parallel to one another along a y-direction and having a length defined in the y-direction, a width defined in an x-direction, and a height defined in the z-direction. For example, a fin height FH of fins 222A, 222B is defined between a top surface of isolation feature 225 and respective top surfaces of fins 222A, 222B along the z-direction. In some embodiments, fin height FH is about 40 nm to about 70 nm. Fins 222A, 222B each have a channel region (C), a source region (S/D), and a drain region (S/D) defined along their length (here, along the y-direction), where the channel region is disposed between the source region and the drain region, both of which are collectively referred to as source/drain (S/D) regions. In some embodiments, fins 222A, 222B are a portion of substrate 210. For example, in the depicted embodiment, where substrate 210 includes silicon, fins 222A, 222B include silicon. Alternatively, fins 222A, 222B are defined in a material layer, such as a semiconductor material layer, disposed on substrate 210. The semiconductor material may be silicon, germanium, silicon germanium, III-V semiconductor material, other suitable semiconductor material, or combinations thereof. In some embodiments, fins 222A, 222B include a stack of semiconductor layers disposed over substrate 210. The semiconductor layers can include same or different materials, dopants, etching rates, constituent atomic percentages, constituent weight percentages, thicknesses, and/or configurations depending on design requirements of FinFET device 200.

A combination of deposition, lithography, and/or etching processes are performed to define fins 222A, 222B extending from substrate 210. For example, forming fins 222A, 222B includes performing a lithography process to form a patterned mask layer over substrate 210 (or a material layer disposed over substrate 210) and performing an etching process to transfer a pattern defined in the patterned mask layer to substrate 210 (or the material layer). The lithography process can include forming a resist layer over substrate 210 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. In some embodiments, the patterned resist layer is the patterned mask layer. In such embodiments, the patterned resist layer is used as an etch mask to remove portions of substrate 210 (or the material layer). In some embodiments, the patterned resist layer is formed over a mask layer formed over substrate 210 before forming the resist layer, and the patterned resist layer is used as an etch mask to remove portions of the mask layer formed over substrate 210. In such embodiments, the patterned mask layer is used as an etch mask to remove portions of substrate 210 (or the material layer). The etching process can include a dry etching process, a wet etching process, other suitable etching process, or combinations thereof. In some embodiments, a reactive ion etching (RIE) process is used to form fins 222A, 222B. After the etching process, the patterned resist layer is removed from substrate 210, for example, by a resist stripping process. In some embodiments, after the etching process, patterned mask layer is removed from substrate 210 (in some embodiments, by a resist stripping process). In some embodiments, the patterned mask layer is removed during etching of substrate 210 (or the material layer). Alternatively, fins 222A, 222B are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some embodiments, directed self-assembly (DSA) techniques are implemented for forming fins 222A, 222B. Further, in some alternate embodiments, the exposure process can implement maskless lithography, e-beam writing, and/or ion-beam writing for patterning.

An isolation feature(s) 225 is formed over and/or in substrate 210 to separate and isolate various regions of FinFET device 200, such as fin 222A from fin 222B. In the depicted embodiment, isolation feature 225 surrounds a lower portion L of fins 222A, 222B. Upper portions U of fins 222A, 222B extend from isolation feature 225 and substrate 210 along the z-direction, such that top surfaces of fins 222A, fins 222B are disposed above a top surface of isolation feature 225 along the z-direction. Isolation feature 225 includes silicon oxide, silicon nitride, silicon oxynitride, other suitable isolation material (for example, including silicon, oxygen, nitrogen, carbon, or other suitable isolation constituent), or combinations thereof. Isolation feature 225 can be configured as a shallow trench isolation (STI) structure, a deep trench isolation (DTI) structure, and/or local oxidation of silicon (LOCOS) structure. For example, isolation feature 225 may be an STI feature that defines and electrically isolates fins 222A, 222B from other device regions (such as fins). The STI feature can be formed by etching a trench in substrate 210 (for example, by using a dry etching process and/or a wet etching process) and filling the trench with insulator material (for example, using a chemical vapor deposition (CVD) process or a spin-on glass process). A chemical mechanical polishing (CMP) process may be performed to remove excess insulator material and/or planarize the top surface of isolation feature 225. In another example, the STI feature can be formed by depositing an insulator material over substrate 210 after forming fins 222A, 222B (in some embodiments, such that the insulator material layer fills gaps (trenches) between fins 222A, 222B) and etching back the insulator material layer to form isolation feature 225. In some embodiments, the STI feature includes a multi-layer structure that fills the trenches, such as a silicon nitride layer disposed over a thermal oxide liner layer. In another example, the STI feature includes a dielectric layer disposed over a doped liner layer (including, for example, boron silicate glass (BSG) or phosphosilicate glass (PSG)). In yet another example, the STI feature includes a bulk dielectric layer disposed over a liner dielectric layer, where the bulk dielectric layer and the liner dielectric layer include materials depending on design requirements of FinFET device 200.

Gate stacks, such as a gate stack 230A and a gate stack 230B, are formed over portions of fins 222A, 222B and over isolation feature 225. Gate stacks 230A, 230B extend lengthwise in a direction that is different than (e.g., orthogonal to) the lengthwise direction of fins 222A, 222B. For example, gate stacks 230A, 230B extend substantially parallel to one another along the x-direction, having a length defined in the x-direction, a width defined in the y-direction, and a height defined in the z-direction. Gate stacks 230A, 230B are disposed between S/D regions of fins 222A, 222B, where channel regions of fins 222A, 222B underlie gate stacks 230A, 230B. In the X-Z plane, gate stacks 230A, 230B wrap top surfaces and sidewall surfaces of fins 222A, 222B. In the Y-Z plane, gate stacks 230A, 230B are disposed over top surfaces of respective channel regions of fins 222A, 222B. In the depicted embodiment, gate stacks 230A, 230B are dummy gate stacks that include a dummy gate electrode 232 and a hard mask 234 disposed over dummy gate electrode 232. Dummy gate electrode 232 includes a suitable dummy gate material, such as a polysilicon layer. Gate stacks 230A, 230B can thus be referred to as poly (PO) gate stacks, in some embodiments. Hard mask layer 234 incudes silicon oxide, silicon carbide, silicon nitride, other suitable hard mask material, or combinations thereof. In some embodiments, gate stacks 230A, 230B further includes a gate dielectric disposed between dummy gate electrode 232 and fins 222A, 222B, where the gate dielectric includes a dielectric material, such as silicon oxide, a high-k dielectric material, other suitable dielectric material, or combinations thereof. In some embodiments, the gate dielectric includes an interfacial layer (for example, a silicon oxide layer) disposed over fins 222A, 222B and a high-k dielectric layer disposed over the interfacial layer. Gate stacks 230A, 230B can include numerous other layers, for example, capping layers, interface layers, diffusion layers, barrier layers, or combinations thereof. Gate stacks 230A, 230B are formed by deposition processes, lithography processes, etching processes, other suitable processes, or combinations thereof. For example, a deposition process is performed to form a dummy gate electrode layer over fins 222A, 222B and isolation feature 225 and a hard mask layer over the dummy gate electrode layer. In some embodiments, before forming the dummy gate electrode layer, a deposition process is performed to form a gate dielectric layer over fins 222A, 222B and/or isolation feature 225. In such embodiments, the dummy gate electrode layer is deposited over the gate dielectric layer. The deposition process includes CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), plasma enhanced ALD (PEALD), low-pressure CVD (LPCVD), atomic layer CVD (ALCVD), atmospheric pressure CVD (APCVD), other suitable methods, or combinations thereof. A gate patterning process (including, for example, various lithography processes, etching processes, and/or cleaning processes) are then performed to pattern the dummy gate electrode layer and the hard mask layer (and, in some embodiments, the gate dielectric layer) to form gate stacks 230A, 230B as depicted in FIG. 2.

Gate stacks 230A, 230B have a gate length $L_{g1}$, which defines a distance (or length) that current (e.g., carriers, such as electrons or holes) travels between S/D regions of fins 222A, 222B. Gate stacks 230A, 230B have a gate footing GF (also referred to as gate skirt or gate ledge) disposed along bottoms of gate stacks 230A, 230B, which results in gate stacks 230A, 230B having a gate length $L_{g2}$ that is greater than gate length $L_{g1}$ along bottoms of gate stacks 230A, 230B. Gate footing GF has a tapered width that increases along the z-direction, such that gate length $L_{g2}$ also increases along the z-direction. Gate footing GF (or a bottom gate profile) of gate stacks 230A, 230B may vary depending on patterning environment (e.g., isolated pattern or dense pattern), position of gate stacks 230A, 230B on a wafer (e.g., edge or center), and/or proximity of area of gate stacks 230A, 230B relative to fins 222A, 222B (e.g., gate area directly adjacent to fins 222A, 222B or gate area at end of gate stacks 230A, 230B). In some embodiments, as depicted, gate footing GF extends along an entire width of gate stacks 230A, 230B. In some embodiments, gate footing GF extends partially along the width of gate stacks 230A, 230B. In some embodiments, gate footing GF is present only at an interface region IF between fins 222A, 222B and gate stacks 230A, 230B, such as at corners between fins 222A, 222B and gate stacks 230A, 230B. Gate footing GF can result unintentionally from the inability of conventional etching processes to achieve substantially vertical sidewalls for high aspect ratio gate patterns. High aspect ratio gate patterns generally refer to gate patterns having a ratio of gate height (e.g., along the z-direction) to gate length (e.g., along the y-direction) that is greater than about 5 (i.e., gate height/gate length≥5). More recently, gate patterning processes have been tuned to intentionally form gate footing GF to minimize (or eliminate) gate collapse concerns that arise for high aspect ratio gate patterns. However, gate footing GF presents new challenges for source/drain fabrication as device dimensions shrink. For example, conventional source/drain fabrication techniques fail to consider proximity of source/drain features to gate footing GF, which affects capacitive coupling between the source/drain features and eventual metal gates of FinFETs. As proximity between source/drain features and gate footing GF decreases, parasitic capacitance between the source/drain features and gate footing GF increases, thereby degrading FinFET performance. In some instances, conventional source/drain fabrication techniques may expose gate footing GF, causing source/drain features to physically contact gate footing GF and result in electrical shorts. The proposed source/drain fabrication techniques thus account for proximity of the source/drain features to gate footing GF and achieve source/drain profiles that minimize parasitic capacitance between the source/drain features and gate footing GF. This has been observed to provide better control over short channel effects of a FinFET device, such as by reducing DIBL, as described further below.

In FIGS. 3B-3D and FIGS. 4B-4D, gate spacers are formed along sidewalls of gate stacks 230A, 230B. In some embodiments, fin spacers are also formed along sidewalls of fins 222A, 222B. Turning to FIG. 3B and FIG. 4B, a spacer layer 240 is formed over FinFET device 200 (for example, at block 122 of method 100). For example, a deposition process is performed to deposit a dielectric layer over fins 222A, 222B, isolation feature 225, and gate stacks 230A, 230B. The deposition process is CVD, PECVD, ALD, PEALD, PVD, other suitable deposition process, or combinations thereof. The dielectric material can include silicon, oxygen, carbon, nitrogen, other suitable spacer constituent, or combinations thereof (for example, silicon oxide, silicon nitride, silicon oxynitride (SiON), silicon carbide, silicon carbon nitride (SiCN), silicon oxycarbide (SiOC), silicon oxycarbon nitride (SiOCN), silicon boron carbon nitride (SiBCN), etc.). In the depicted embodiment, spacer layer 240 includes silicon and nitrogen (and thus may be referred to as a silicon nitride layer). In some embodiments, spacer layer 240 is a single layer, such as one silicon nitride layer. In some embodiments, spacer layer 240 includes multiple layers, such as a first dielectric layer disposed over a second dielectric layer. For example, the first dielectric layer can include silicon carbon nitride and the second dielectric layer can include silicon nitride. In furtherance of the depicted embodiment, a thickness t of spacer layer 240 is about 5 nm to about 15 nm. In some embodiments, spacer layer 240 has a substantially uniform thickness along top surfaces and sidewall surfaces of gate stacks 230A, 230B and fins 222A, 222B. For example, a thickness of spacer layer 240 along top surfaces of gate stacks 230A, 230B and top surface of isolation feature 225 is substantially the same as a thickness of spacer layer 240 along sidewall surfaces of gate stacks 230A, 230B. A thickness of spacer layer 240 along top surfaces of fins 222A, 222B and top surface of isolation layer 225 is also substantially the same as a thickness of spacer layer 240 along sidewall surfaces of fins 222A, 222B. In some embodiments, spacer layer 240 is formed by a conformal deposition process, such that spacer layer 240 conforms to surfaces of FinFET device 200 upon which spacer layer 240 is deposited (and may thus be referred to as a conformal spacer layer).

Processing then proceeds with performing a spacer etch process (for example, at block 124 and block 126 of method 100) on spacer layer 240 to form gate spacers 242 along sidewalls of gate stacks 230A, 230B and fin spacers 244 along sidewalls of fins 222A, 222B. The spacer etch process includes a first spacer etch (FIG. 3C and FIG. 4C, referred to as a spacer main etch (SME)) and a second spacer etch (FIG. 3D and FIG. 4D, referred to as a spacer over etch (SOE)). During the spacer etch process, first spacer etch and/or second spacer etch may unintentionally or intentionally remove a portion of fins 222A, 222B in the S/D regions, thereby beginning formation of source/drain recesses 250 in the S/D regions of fins 222A, 222B. In some embodiments, after forming gate spacers 242, a depth of source/drain recesses 250 is less than about 20% of fin height FH. For example, source/drain recesses 250 have a depth d1 after first spacer etch (FIG. 3C and FIG. 4C) and a depth d2 after second spacer etch (FIG. 3D and FIG. 4D). Depth d1 is measured between respective top surfaces of fins 222A, 222B and respective portions of fins 222A, 222B defining bottommost surfaces of source/drain recesses 250 after first spacer etch. Depth d2 is measured between respective top surfaces of fins 222A, 222B and respective portions of fins 222A, 222B defining bottommost surfaces of source/drain recesses 250 after second spacer etch. In some embodiments, depth d1 is less than or equal to about 10% of fin height FH and depth d2 is about 10% to about 20% of fin height FH. In some embodiments, depth d1 is about 4 nm to about 10 nm. In some embodiments, depth d2 is about 4 nm to about 15 nm. The present disclosure also contemplates embodiments where first spacer etch and/or second spacer etch do not remove portions of fins 222A, 222B in the S/D regions, such that depth d1 and/or depth d2 may be equal to 0, in some embodiments.

Turning to FIG. 3C and FIG. 4C, first spacer etch selectively removes spacer layer 240 with respect to gate stacks 230A, 230B, isolation feature 225, and/or fins 222A, 222B. In other words, first spacer etch substantially removes spacer layer 240 but does not remove, or does not substantially remove, gate stacks 230A, 230B, isolation feature 225, and/or fins 222A, 222B. First spacer etch removes spacer layer 240 substantially from horizontal (lateral) surfaces of FinFET device 200, such as top surfaces of fins 222A, 222B, top surfaces of isolation feature 225, and top surfaces of gate stacks 230A, 230B, thereby forming gate spacers 242 having thickness t1 along sidewalls of gate stacks 230A, 230B and fin spacers 244 along sidewalls of fins 222A, 222B. In some embodiments, thickness t1 is about 3 nm to about 10 nm. First spacer etch may also remove portions of fins 222A, 222B in S/D regions to begin formation of source/drain recesses 250. For example, source/drain recesses 250 have depth d1 after first spacer etch. In some embodiments, gate spacers 242 includes more than one set of spacers, such as seal spacers, offset spacers, sacrificial spacers, dummy spacers, and/or main spacers depending on design and/or processing requirements for FinFET device 200.

First spacer etch is an anisotropic etch process, which generally refers to an etch process having different etch rates in different directions, such that the etch process removes material in specific directions, such as substantially in one direction. For example, first spacer etch has a vertical etch rate that is greater than a horizontal etch rate (in some embodiments, the horizontal etch rate equals zero). First spacer etch thus removes material in substantially the vertical direction (here, z-direction) with minimal (to no) material removal in the horizontal direction (here, x-direction and/or y-direction). In some embodiments, first spacer etch is a dry etch process, such as an RIE process, that uses a fluorine-containing etch gas to remove the material of spacer layer 240 (e.g., silicon nitride) at a higher rate than the materials of gate stacks 230A, 230B (e.g., oxide hard mask or polysilicon), isolation feature 225 (e.g., silicon oxide), and/or fins 222A, 222B (e.g., silicon) (i.e., the etchant has a high etch selectivity with respect to silicon nitride). In some embodiments, first spacer etch is configured to generate a fluorine-containing plasma from the fluorine-containing gas, such that first spacer etch removes portions of spacer layer 240 using plasma-excited fluorine-containing species. The fluorine-containing etch gas includes fluorine ($F_2$), fluoromethane (e.g., $CH_3F$), difluoromethane (e.g., $CH_2F_2$), trifluoromethane (e.g., $CHF_3$), tetrafluoromethane (e.g., $CF_4$), hexafluoroethane (e.g., $C_2F_6$), sulfur hexafluoride (e.g., $SF_6$), nitrogen trifluoride (e.g., $NF_3$), other fluorine-containing etchant, or combinations thereof. First spacer etch can, alternatively or additionally, use a hydrogen-containing etch gas (for example, $H_2$ and/or $CH_4$), a nitrogen-containing etch gas (for example, $N_2$ and/or $NH_3$), a chlorine-containing etch gas (for example, $Cl_2$, $CHCl_3$, $CCl_4$, and/or $BCl_3$), an oxygen-containing etch gas (for example, $O_2$), a bromine-containing etch gas (for example, HBr and/or $CHBr_3$), an iodine-containing etch gas, other suitable etch gas, or combinations thereof. First spacer etch may be configured to generate a plasma from any of the etch gases disclosed herein, such that first spacer etch uses plasma-excited species for etching. In some embodiments, a carrier gas is used to deliver the fluorine-containing etch gas and/or other etch gas. The carrier gas may be an inert gas, such as an argon-containing gas, a helium-containing gas, a xenon-containing gas, other suitable inert gas, or combinations thereof. In some embodiments, first spacer etch is a wet, anisotropic etch process.

Various etch parameters of first spacer etch can be tuned to achieve selective and anisotropic etching of spacer layer 240, such as etch gas composition, carrier gas composition, etch gas flow rate, carrier gas flow rate, etch time, etch pressure, etch temperature, source power, radio frequency (RF) and/or direct current (DC) bias voltage, RF and/or DC bias power, other suitable etch parameters, or combinations thereof. In some embodiments, first spacer etch utilizes an etch gas that includes $CF_4$ to selectively etch spacer layer 240, where a flow rate of $CF_4$, an etch time, an etch temperature, an etch pressure, and/or an RF power may be tuned to achieve desired etch selectivity. In some embodiments, a flow rate of $CF_4$ is about 200 sccm to about 300 sccm. In some embodiments, first spacer etch utilizes an etch gas that includes $CF_4$ and HBr, where a ratio of $CF_4$ to HBr, an etch time, an etch temperature, an etch pressure, and/or an RF power may be tuned to achieve desired etch selectivity. In some embodiments, a ratio of a flow rate of $CF_4$ to a flow rate of HBr is about 1:2 to about 2:1. In some embodiments, a flow rate of $CF_4$ is about 200 sccm to about 300 sccm. In some embodiments, a flow rate of HBr is about 200 sccm to about 300 sccm. In some embodiments, a duration of first spacer etch is about 5 seconds to about 50 seconds. In some embodiments, an RF power used for generating a fluorine-containing plasma for first spacer etch is about 400 W to about 500 W. In some embodiments, a pressure maintained in a process chamber during first spacer etch is about 10 mTorr to about 50 mTorr. In some embodiments, a temperature maintained in the process chamber during first spacer etch is about 20° C. to about 70° C. In some embodiments, the various etch parameters of first spacer etch are tuned to achieve desired etching of fins 222A, 222B. In some embodiments, the various etch parameters of first spacer etch are tuned to achieve a desired thickness and/or a desired profile for gate spacers 242 and/or fin spacers 244.

Turning to FIG. 3D and FIG. 4D, second spacer etch is performed to remove any remaining material of spacer layer 240 (e.g., residue) along horizontal surfaces of FinFET device 200, such as top surfaces of fins 222A, 222B, top surfaces of isolation feature 225, and top surfaces of gate stacks 230A, 230B. For example, second spacer etch selectively removes any remaining material of spacer layer 240 with respect to gate stacks 230A, 230B, isolation feature 225, and/or fins 222A, 222B. In other words, second spacer etch substantially removes spacer layer 240 but does not remove, or does not substantially remove, gate stacks 230A, 230B, isolation feature 225, and/or fins 222A, 222B. Second spacer etch may also remove portions of fins 222A, 222B in S/D regions to begin and/or continue formation of source/drain recesses 250. For example, source/drain recesses 250 have depth d2 after second spacer etch, where depth d2 is greater than depth d1. Second spacer etch may also be used to adjust thickness t1 and/or a profile of gate spacers 242 and/or a thickness and/or a profile of fin spacers 244.

Second spacer etch is an anisotropic etch process. For example, second spacer etch has a vertical etch rate that is greater than a horizontal etch rate (in some embodiments, the horizontal etch rate equals zero). Second spacer etch thus removes material in substantially the vertical direction (here, z-direction) with minimal (to no) material removal in the horizontal direction (here, x-direction and/or y-direction). In some embodiments, an etch selectivity of silicon nitride (i.e., spacer layer 240) to silicon (i.e., fins 222A, 222B) of second spacer etch is greater than an etch selectivity of silicon nitride to silicon of first spacer etch. In such embodiments, fins 222A, 222B may be etched more by first spacer etch than second spacer etch, such that a thickness (or depth) of fins 222A, 222B removed by first spacer etch is more than a thickness (or depth) of fins 222A, 222B removed by second spacer etch. In some embodiments, second spacer etch is a dry etch process, such as an RIE process, that uses a fluorine-and-hydrogen containing etch gas to remove the material of spacer layer 240 (e.g., silicon nitride) at a higher rate than the materials of gate stacks 230A, 230B (e.g., oxide hard mask or polysilicon), isolation feature 225 (e.g., silicon oxide), and/or fins 222A, 222B (e.g., silicon) (i.e., the etchant has a high etch selectivity with respect to silicon nitride). In some embodiments, second spacer etch is configured to generate a fluorine-and-hydrogen containing plasma from the fluorine-and-hydrogen containing gas, such that second spacer etch removes portions of spacer layer 240 using plasma-excited fluorine-and-hydrogen containing species. The fluorine-and-hydrogen containing etch gas includes fluoromethane (e.g., $CH_3F$), difluoromethane (e.g., $CH_2F_2$), trifluoromethane (e.g., $CHF_3$), other fluorine-and-hydrogen containing etchant, or combinations thereof. Second spacer etch can, alternatively or additionally, use a hydrogen-containing etch gas (for example, $H_2$ and/or $CH_4$), a nitrogen-containing etch gas (for example, $N_2$ and/or $NH_3$), a chlorine-containing etch gas (for example, $Cl_2$, $CHCl_3$, $CCl_4$, and/or $BCl_3$), an oxygen-containing etch gas (for example, $O_2$), a bromine-containing etch gas (for example, HBr and/or $CHBr_3$), an iodine-containing etch gas, a fluorine-containing etch gas (for example, $F_2$, $CF_4$, $C_2F_6$, $SF_6$, and/or $NF_3$), other suitable etch gas, or combinations thereof. Second spacer etch may be configured to generate a plasma from any of the etch gases disclosed herein, such that second spacer etch uses plasma-excited species for etching. In some embodiments, a carrier gas is used to deliver the fluorine-and-hydrogen containing etch gas and/or other etch gas. The carrier gas may be an inert gas, such as an argon-containing gas, a helium-containing gas, a xenon-containing gas, other suitable inert gas, or combinations thereof. In some embodiments, second spacer etch is a wet, anisotropic etch process.

Various etch parameters of second spacer etch can be tuned to achieve selective and anisotropic etching of spacer layer 240, such as etch gas composition, carrier gas composition, etch gas flow rate, carrier gas flow rate, etch time, etch pressure, etch temperature, source power, RF and/or DC bias voltage, RF and/or DC bias power, other suitable etch parameters, or combinations thereof. In some embodiments, second spacer etch utilizes an etch gas that includes $CH_3F$ and $O_2$, where a ratio of $CH_3F$ to $O_2$, an etch time, an etch temperature, an etch pressure, and/or an RF power may be tuned to achieve desired etch selectively. In some embodiments, a ratio of a flow rate of $CH_3F$ to a flow rate of $O_2$ is about 1:1 to about 4:1. In some embodiments, a flow rate of $CH_3F$ is about 100 sccm to about 200 sccm. In some embodiments, a flow rate of $O_2$ is about 50 sccm to about 150 sccm. In some embodiments, a duration of second spacer etch is about 5 seconds to about 50 seconds. In some embodiments, an RF power used for generating a hydrogen-and-fluorine containing plasma for second spacer etch is about 400 W to about 500 W. In some embodiments, a pressure maintained in a process chamber during second spacer etch is about 10 mTorr to about 50 mTorr. In some embodiments, a temperature maintained in the process chamber during second spacer etch is about 20° C. to about 70° C. In some embodiments, the various etch parameters of second spacer etch are tuned to achieve desired etching of fins 222A, 222B in S/D regions 250. In some embodiments, the various etch parameters of first spacer etch are tuned to achieve a desired thickness and/or a desired profile for gate spacers 242 and/or fin spacers 244.

Figures 3E, 4E:
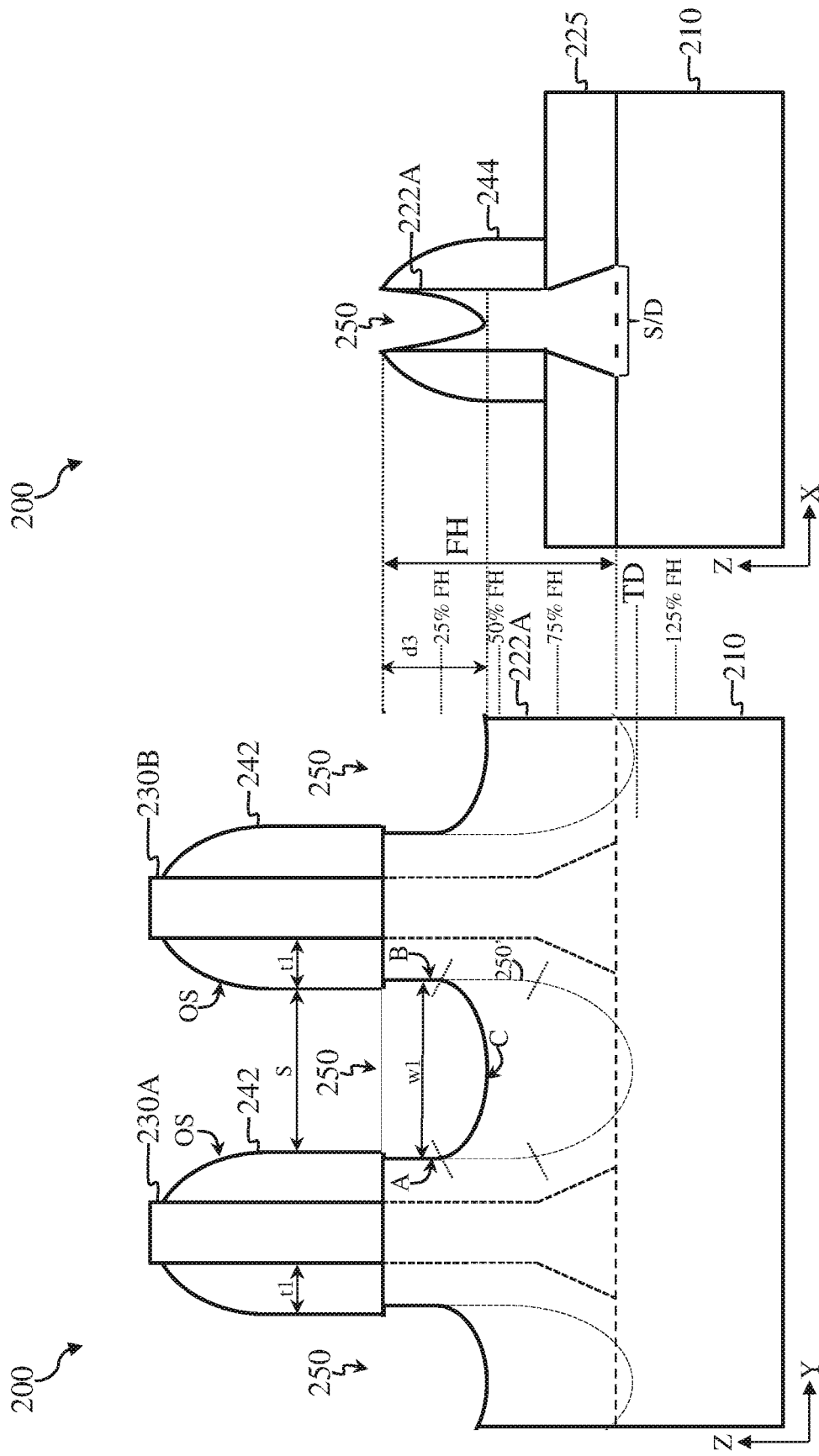

Processing then proceeds, as depicted in FIGS. 3E-3G and FIGS. 4E-4G, with performing a three-step source/drain etch process to form source/drain recesses 250 in S/D regions of fins 222A, 222B. Source/drain recesses 250 extend in fins 222A, 222B to a target depth TD after the three-step source/drain etch process. In some embodiments, target depth TD is about 80% to about 120% of fin height FH (e.g., about 120% of fin height FH). In some embodiments, target depth TD is about 30 nm to about 80 nm. When fabricating gate spacers 242 begins formation of source/drain recesses 250, such as in the depicted embodiment, three-step source/drain etch process completes formation of source/drain recesses 250. In the depicted embodiment, three-step source/drain etch process includes a first anisotropic source/drain etch (FIG. 3E and FIG. 4E), an isotropic source/drain etch (FIG. 3F and FIG. 4F), and a second anisotropic source/drain etch (FIG. 3G and FIG. 4G). Three-step source/drain etch process provides precise control of a location of tips of epitaxial source/drain features (in particular, a depth of the tips in fins 222A, 222B and a proximity (distance) of the tips to the channel regions of fins 222A, 222B) and a distance between a bottom portion of the epitaxial source/drain features and the channel region and/or the gate stack. For example, first anisotropic source/drain etch and isotropic source/drain etch are tuned to achieve a location of tips of epitaxial source/drain features before extending source/drain recesses to target depth TD. In some embodiments, the location of tips of epitaxial source/drain features is defined before the source/drain recesses reach a depth that is greater than about 80% of fin height FH (i.e., a depth of source/drain recesses after first anisotropic source/drain etch and isotropic source/drain etch is less than or equal to about 80% of fin height FH). Extending the source/drain recesses to target depth after defining the location of tips of epitaxial source/drain features pulls back a proximity of a bottom portion of the epitaxial source/drain features from gate footing GF, which reduces parasitic capacitance between the epitaxial source/drain features and the gate stack.

Turning to FIG. 3E and FIG. 4E, first anisotropic source/drain etch extends source/drain recesses 250 to a depth d3 in S/D regions of fins 222A, 222B. Depth d3 is measured between respective top surfaces of fins 222A, 222B and respective portions of fins 222A, 222B defining bottommost surfaces of source/drain recesses 250 after first anisotropic source/drain etch. Depth d3 is less than target depth TD and is selected based on a desired tip depth of source/drain recesses 250 (i.e., a depth of a tip along fin height FH). In some embodiments, depth d3 is about 10% to about 80% of fin height FH depending on desired tip depth. In some embodiments, after the three-step source/drain recess etch, a location of tip depth along fin height FH is about 40% to about 60% of depth d3 (i.e., 0.4d3≤tip depth≤0.6d3). In such embodiments, where desired tip depth is about 20% to about 30% of fin height FH, first anisotropic source/drain etch is performed until depth d3 is about 50% of fin height FH. In some embodiments, depth d3 is selected so the tip depth is less than about 50% of fin height FH. For example, depth d3 is selected to achieve a tip depth of about 10% to about 30% of fin height FH. In such embodiments, depth d3 can be about 25% to about 50% of fin height FH. In some embodiments, depth d3 is about 10 nm to about 60 nm. Where first spacer etch and second spacer etch begin formation of source/drain recesses 250, such as in the depicted embodiment, depth d3 is greater than depth d1, depth d2, and a sum of depth d1 and depth d2.

First anisotropic source/drain etch is controlled to produce source/drain recesses 250 having U-shaped profiles in the Y-Z plane. For example, after first anisotropic source/drain etch, source/drain recesses 250 are defined by a sidewall segment A, a sidewall segment B, and a bottom segment C that extends between sidewall segment A and sidewall segment B. Sidewall segment A is substantially linear, sidewall segment B is substantially linear, and bottom segment C is curvilinear. In the depicted embodiment, sidewall segment A and sidewall segment B extend substantially parallel to one another along the z-direction. Source/drain recesses 250 have a width w1. In some embodiments, width w1 is about 10 nm to about 35 nm. In furtherance of the depicted embodiment, source/drain recesses 250 extend under gate spacers 242, resulting in sidewall segment A being offset a distance along the y-direction from an outer sidewall OS of a respective gate spacer 242 along gate stack 230A and sidewall segment B being offset a distance along the y-direction from an outer sidewall OS of a respective gate spacer 242 along gate stack 230B. In such embodiments, width w1 is greater than a spacing S between outer sidewalls OSs of gate spacers 242. In some embodiments, source/drain recesses 250 do not extend under gate spacers 242. For example, sidewall segment A may be substantially aligned along the z-direction with outer sidewall OS of respective gate spacer 242 along gate stack 230A and sidewall segment B may be substantially aligned along the z-direction with outer sidewall OS of respective gate spacer 242 along gate stack 230B. In such embodiments, width w1 is about equal to spacing S between outer sidewalls OSs of gate spacers 242. The present disclosure also contemplates embodiments where sidewall segment A and sidewall segment B are substantially linear having slight slope in the Y-Z plane, such as sidewall segment A having a slight negative slope and sidewall segment B having a slight positive slope.

First anisotropic source/drain etch selectively removes fins 222A, 222B with respect to gate spacers 242, fin spacers 244, gate stacks 230A, 230B, and/or isolation feature 225. In other words, first anisotropic source/drain etch substantially removes fins 222A, 222B but does not remove, or does not substantially remove, gate spacers 242, fin spacers 244, gate stacks 230A, 230B, and/or isolation feature 225. First anisotropic source/drain etch has a vertical etch rate that is greater than a horizontal etch rate (in some embodiments, the horizontal etch rate is zero). First anisotropic source/drain etch thus removes portions of fins 222A, 222B in substantially the vertical direction (here, z-direction) with minimal (to no) removal of material in the horizontal direction (here, x-direction and/or y-direction). For example, first anisotropic source/drain etch has a ratio of a vertical etch rate (VER) to a horizontal etch rate (HER) that is greater than about 20 (e.g., 20≤VER/HER≤80). In some embodiments, first anisotropic source/drain etch is controlled to exhibit a desired degree of anisotropy (A), which is defined as one minus a ratio of HER to VER (i.e., A=1−HER/VER). In some embodiments, a degree of anisotropy is about 0.95 to about 1. In some embodiments, vertical etching refers to etching downward in a direction perpendicular to top surfaces of fins 222A, 222B, and horizontal etching refers to etching in directions parallel to top surfaces of fins 222A, 222B. In some embodiments, first anisotropic source/drain etch is a dry etch process, such as an RIE process, that uses a bromine-containing etch gas to remove the material of fins 222A, 222B (e.g., silicon) at a higher rate than the materials of gate spacers 242 (e.g., silicon nitride), fin spacers 244 (e.g., silicon nitride), gate stacks 230A, 230B (e.g., oxide hard mask or polysilicon), and/or isolation feature 225 (e.g., silicon oxide) (i.e., the etchant has a high etch selectivity with respect to silicon). The bromine-containing etch gas includes bromine (Br), hydrogen bromide (HBr), bromomethane ($CH_3Br$), dibromomethane ($CH_2Br_2$), bromoform ($CHBr_3$), other bromine-containing etchant, or combinations thereof. In some embodiments, first anisotropic source/drain etch is configured to generate a bromine-containing plasma from the bromine-containing etch gas, such that first anisotropic source/drain etch removes portions of fins 222A, 222B in S/D regions using plasma-excited bromine-containing species. First anisotropic source/drain etch can, alternatively or additionally, use a hydrogen-containing etch gas (for example, $H_2$ and/or $CH_4$), a nitrogen-containing etch gas (for example, $N_2$ and/or $NH_3$), a chlorine-containing etch gas (for example, $Cl_2$, $CHCl_3$, $CCl_4$, and/or $BCl_3$), an oxygen-containing etch gas (for example, $O_2$), a fluorine-containing etch gas (for example, $F_2$, $CH_3F$, $CH_2F_2$, $CHF_3$, $CF_4$, $C_2F_6$), an iodine-containing etch gas, other suitable etch gas, or combinations thereof. In some embodiments, a carrier gas is used to deliver the etch gas. The carrier gas may be an inert gas, such as an argon-containing gas, a helium-containing gas, a xenon-containing gas, other suitable inert gas, or combinations thereof. In some embodiments, first anisotropic source/drain etch is a wet, anisotropic etch process.

Various etch parameters of first anisotropic source/drain etch are tuned to control selective and anisotropic etching of fins 222A, 222B to produce desired depth d3 and U-shaped profiles of source/drain recesses 250, such as etch gas composition, carrier gas composition, etch gas flow rate, carrier gas flow rate, etch time, etch pressure, etch temperature, source power, RF and/or DC bias voltage, RF and/or DC bias power, other suitable etch parameters, or combinations thereof. In some embodiments, first anisotropic source/drain etch utilizes an etch gas that includes HBr, where a flow rate of HBr, an etch time, an etch temperature, an etch pressure, and/or an RF power may be tuned to achieve desired etch selectivity and/or desired source/drain recess profile. In such embodiments, a flow rate of HBr is about 100 sccm to about 200 sccm. In some embodiments, a duration of first anisotropic source/drain etch is about 30 seconds to about 80 seconds. In some embodiments, RF power used for generating a bromine-containing plasma is about 300 W to about 400 W. In some embodiments, a pressure maintained in a process chamber during first anisotropic source/drain etch is about 5 mTorr to about 30 mTorr. In some embodiments, a temperature maintained in the process chamber during first anisotropic source/drain etch is about 20° C. to about 70° C. In some embodiments, first anisotropic source/drain etch utilizes an etch gas that includes $Cl_2$, where a flow rate of $Cl_2$, an etch time, an etch temperature, an etch pressure, and/or an RF power may be tuned to achieve desired etch selectivity and/or desired source/drain recess profile.

Turing to FIG. 3F and FIG. 4F, isotropic source/drain etch is performed to widen source/drain recesses 250 and control a tip proximity of tips source/drain recesses 250. Isotropic source/drain etch is controlled to produce source/drain recesses 250 having bowl-shaped profiles in the Y-Z plane. For example, after isotropic source/drain etch, source/drain recesses 250 are defined by a sidewall segment A', a sidewall segment B', and a bottom segment C' that extends between sidewall segment A' and sidewall segment B'. Sidewall segment A' is curvilinear, sidewall segment B' is curvilinear, and bottom segment C' is curvilinear. Sidewall segment A' extends away from a top surface of fins 222A, 222B towards gate stack 230A to a source/drain tip v1, where sidewall segment A' meets bottom segment C'. Sidewall segment B' extends away from a top surface of fins 222A, 222B towards gate stack 230B to a source/drain tip v2, where sidewall segment B' meets bottom segment C'. Such configuration results in source/drain recesses 250 having a wide central portion disposed between narrower end portions, where the narrower end portions have widths that decreasingly taper along the z-direction away from the wide central portion. Source/drain recesses 250 thus have a width w2 that varies along fin height FH, where width w2 equals a maximum width of source/drain recesses 250 between source/drain tip v1 and source/drain tip v2. Source/drain tips v1, v2 have an initial tip depth dti, where tip depth generally refers to a vertical distance between a gate stack (and/or top surface of a fin) and a portion of a source/drain feature that is closest to the gate stack (i.e., a tip). In some embodiments, initial tip depth dti is about 10% to about 40% of fin height FH. Source/drain tips v1, v2 also have an initial tip proximity pi, where tip proximity generally refers to a lateral distance between a sidewall of a gate stack and a portion of a source/drain feature that is closest to the sidewall of the gate stack (i.e., a distance between source/drain tips v1, v2 and a respective channel region). In some embodiments, initial tip proximity pi is about 60% to about 90% of thickness t1 of gate spacers 242 (e.g., 0.60≤p≤0.9t1). In some embodiments, initial tip proximity pi is about 5 nm to about 8 nm. Isotropic source/drain etch may also deepen source/drain recesses 250, for example, extending source/drain recesses 250 to a depth d4 that is greater than depth d3 and less than target depth TD. Depth d4 is measured between respective top surfaces of fins 222A, 222B and respective portions of fins 222A, 222B defining bottommost surfaces of source/drain recesses 250 after isotropic source/drain etch. In some embodiments, depth d4 is about 10% to about 80% of fin height FH, such as about 50% of fin height FH. In some embodiments, depth d4 is about 10 nm to about 70 nm.

Isotropic source/drain etch selectively removes fins 222A, 222B with respect to gate spacers 242, fin spacers 244, gate stacks 230A, 230B, and/or isolation feature 225. In other words, isotropic source/drain etch substantially removes fins 222A, 222B but does not remove, or does not substantially remove, gate spacers 242, fin spacers 244, gate stacks 230A, 230B, and/or isolation feature 225. In contrast to first anisotropic source/drain etch, isotropic source/drain etch etches in multiple directions (in some embodiments, the vertical etch rate is the same as the horizontal etch rate). Isotropic source/drain etch thus removes portions of fins 222A, 222B in all directions (here, z-direction, y-direction, and x-direction). For example, isotropic source/drain etch has a ratio of VER to HER that is about 1. In some embodiments, isotropic source/drain etch has a ratio of VER to HER that is about 1 to about 5 (e.g., 1≤VER/HER≤5). In some embodiments, isotropic source/drain etch is controlled to exhibit a degree of anisotropy that is less than the degree of anisotropy of first anisotropic source/drain etch. For example, a degree of anisotropy of isotropic source/drain etch is less than about 0.8 (in some embodiments, 0). In some embodiments, isotropic source/drain etch is a dry etch process, such as an RIE process, that uses a fluorine-and-chlorine containing etch gas to remove the material of fins 222A, 222B (e.g., silicon) at a higher rate than the materials of gate spacers 242 (e.g., silicon nitride), fin spacers 244 (e.g., silicon nitride), gate stacks 230A, 230B (e.g., oxide hard mask or polysilicon), and/or isolation feature 225 (e.g., silicon oxide) (i.e., the etchant has a high etch selectivity with respect to silicon). The fluorine-and-chlorine containing etch gas includes a fluorine-containing etchant (e.g., $F_2$, $CH_3F$, $CH_2F_2$, $CHF_3$, $CF_4$, $C_2F_6$, $SF_6$, $NF_3$, other fluorine-containing etchant, or combinations thereof) and a chlorine-containing etchant (e.g., for example, $Cl_2$, $CHCl_3$, $CCl_4$, $BCl_3$, other chlorine-containing etchant, or combinations thereof). In some embodiments, isotropic source/drain etch is configured to generate a fluorine-and-chlorine containing plasma from the fluorine-and-chlorine containing etch gas, such that isotropic source/drain etch removes portions of fins 222A, 222B using plasma-excited fluorine-containing species and/or plasma-excited chlorine-containing species. Isotropic source/drain etch can, alternatively or additionally, use a hydrogen-containing etch gas (for example, $H_2$ and/or $CH_4$), a nitrogen-containing etch gas (for example, $N_2$ and/or $NH_3$), an oxygen-containing etch gas (for example, $O_2$), a bromine-containing etch gas (for example, HBr and/or $CHBr_3$), an iodine-containing etch gas, other suitable etch gas, or combinations thereof. In some embodiments, a carrier gas is used to deliver the etch gas. The carrier gas may be an inert gas, such as an argon-containing gas, a helium-containing gas, a xenon-containing gas, other suitable inert gas, or combinations thereof. In some embodiments, isotropic source/drain etch is a wet etch process that uses an etch solution that includes nitric acid ($HNO_3$) and hydrofluoric acid (HF). In some embodiments, the etch solution further includes acetic acid ($CH_3COOH$). The present disclosure contemplates other etch solutions for isotopically and selectively wet etching.

Various etch parameters of isotropic source/drain etch can be tuned to control selective and isotropic etching of fins 222A, 222B to produce desired tip proximity pi, desired tip depth di, and desired bowl-shaped profiles of source/drain recesses 250, such as etch gas composition, carrier gas composition, etch gas flow rate, carrier gas flow rate, etch time, etch pressure, etch temperature, source power, RF and/or DC bias voltage, RF and/or DC bias power, other suitable etch parameters, or combinations thereof. In some embodiments, isotropic source/drain etch utilizes an etch gas that includes $NF_3$ and $Cl_2$ to selectively etch fins 222A, 222B, where a ratio of a flow rate of $NF_3$ to a flow rate of $Cl_2$, a flow rate of $NF_3$, a flow rate of $Cl_2$, an etch time, an etch temperature, an etch pressure, and/or an RF power may be tuned to achieve desired etch selectivity and/or desired source/drain recess profile. In some embodiments, a ratio of a flow rate of $NF_3$ to a flow rate of $Cl_2$ is about 1:7 to about 1:1. In some embodiments, a flow rate of $NF_3$ is about 100 sccm to about 300 sccm. In some embodiments, a flow rate of $Cl_2$ is about 100 sccm to about 200 sccm. In some embodiments, a duration of isotropic source/drain etch is about 5 seconds to about 50 seconds. In some embodiments, RF power used for generating a fluorine-and-oxygen containing plasma for isotropic source/drain etch is about 300 W to about 400 W. In some embodiments, a pressure maintained in a process chamber during isotropic source/drain etch is about 5 mTorr to about 50 mTorr. In some embodiments, a temperature maintained in the process chamber during isotropic source/drain etch is about 20° C. to about 70° C.

Turning to FIG. 3G and FIG. 4G, second anisotropic source/drain etch extends source/drain recesses 250 to a depth d5, which is substantially equal to target depth TD. Depth d5 is measured between respective top surfaces of fins 222A, 222B and respective portions of fins 222A, 222B defining bottommost surfaces of source/drain recesses 250 after second anisotropic source/drain etch. In some embodiments, depth d5 is about 80% to about 120% of fin height FH (for example, about 120% of fin height FH). In some embodiments, depth d5 is about 30 nm to about 80 nm. Second anisotropic source/drain etch is controlled to produce source/drain recesses 250 having a profile in the Y-Z plane that resembles a light portion of a candle-shaped light bulb. For example, after second anisotropic source/drain etch, source/drain recesses 250 are defined by a sidewall segment A", a sidewall segment B", and a bottom segment C" that extends between sidewall segment A" and sidewall segment B". Sidewall segment A" is substantially linear having positive slope in the Y-Z plane, sidewall segment B" is substantially linear having negative slope in the Y-Z plane, and bottom segment C" is curvilinear. Accordingly, sidewall segment A" extends away from a top surface of fins 222A, 222B towards gate stack 230A to source/drain tip v1, where sidewall segment A" meets bottom segment C", and sidewall segment B" extends away from a top surface of fins 222A, 222B towards gate stack 230B to source/drain tip v2, where sidewall segment B" meets bottom segment C". Such configuration results in source/drain recesses 250 maintaining a maximum width between source/drain tip v1 and source/drain tip v2. A first portion of source/drain recesses 250, defined between sidewall segment A" and sidewall segment B", has a width w3 that increases from top surfaces of fins 222A, 222B to the maximum width of source/drain recesses 250. A second portion of source/drain recesses 250, defined between sidewall portions of bottom segment C", has a width w4 that decreases from the maximum width of source/drain recesses 250 to a width less than the maximum width (in some embodiments, 0). In the depicted embodiment, bottom segment C" has a substantially V-shaped blunt-tip profile. For example, bottom segment C" have substantially linear sidewalls, where the substantially linear sidewalls have opposite slope and taper into a curved bottom instead of a point. The present disclosure also contemplates embodiments where sidewall segment A" and/or sidewall segment B" are curvilinear. For example, sidewall segment A" and/or sidewall segment B" may initially curve towards one another from top surfaces of fins 222A, fins 222B and then curve away from one another towards source/drain tips v1, v2, respectively, thereby forming convex surfaces that define the first portion of source/drain recesses 250 therebetween.

Source/drain recesses 250 have profiles that improve performance of FinFET device 200 compared to profiles of conventional source/drain recesses 250', which result from source/drain fabrication techniques that customize a location of source/drain tips after reaching target depth TD. For example, a location of source/drain tips v1, v2 is closer to gate stacks 230A, 230B (and thus closer to channel regions of FinFET device 200) compared to a location of source/drain tips z1, z2 of conventional source/drain recesses 250'. Source/drain tips v1, v2 have a tip depth dt and a tip proximity pt that optimize performance of FinFET device 200. In some embodiments, tip depth dt is about 10% to about 40% of fin height FH, and tip proximity pt is about 50% to about 90% of thickness t1 of gate spacers 242, which has been observed to reduce parasitic resistance between subsequently formed source/drain features and subsequently formed metal gates. In some embodiments, tip depth dt is about 10 nm to about 30 nm (for example, about 20 nm), and tip proximity pt is about 5 nm to about 8 nm (for example, about 6 nm). Tip depth dt greater than about 40% of fin height FH (in some embodiments, greater than about 30 nm) has been observed to pull a bottom of source/drain recesses 250 towards gate stacks 230A, 230B during processing, undesirably decreasing proximity footing pf and increasing parasitic capacitance between subsequently formed source/drain features and subsequently formed metal gates, as described herein. Tip depth dt less than about 10% of fin height FH (in some embodiments, less than about 10 nm) may increase parasitic resistance. Tip proximity pt less than 50% of thickness t1 of gate spacers 242 (in some embodiments, about 8 nm) has been observed to increase resistance between subsequently formed source/drain features and the channel region, reducing carrier mobility, while tip proximity pt greater than 90% of thickness t1 of gate spacers 242 (in some embodiments, about 5 nm) has been observed to push subsequently formed source/drain features too close to the channel region, which can lead to undesired short channel effects and/or off-state current leakage. Tip depth dt may be greater than, less than, or the same as initial tip depth dti. In some embodiments, second anisotropic source/drain etch may increase, decrease, and/or have no effect on tip depth depending on the various etch parameters of second anisotropic source/drain etch. In the depicted embodiment, second anisotropic source/drain etch results in tip depth dt being greater than initial tip depth dti. In some embodiments, second anisotropic source/drain etch may increase and/or have no effect on tip proximity depending on the various etch parameters of second anisotropic source/drain etch. In the depicted embodiment, second anisotropic source/drain etch is tuned to ensure tip proximity pt is substantially the same as initial tip proximity pi. After second source/drain anisotropic etch, a proximity of a bottom portion of source/drain recesses 250 (in particular, bottom segment C") to gate footing GF (referred to as proximity footing pf) also improves performance of FinFET device 200. For example, because a location of source/drain tips v1, v2 is substantially defined by first source/drain anisotropic etch and isotropic source/drain etch before source/drain recesses 250 reach target depth TD, proximity footing pf of source/drain recesses 250 is greater than a proximity footing pf' of conventional source/drain recesses 250', which results from conventional source/drain fabrication techniques. In some embodiments, proximity footing pf is greater than or equal to about 8 nm, in particular, at depths greater than about 80% of fin height FH. Increasing proximity footing (for example, greater than or equal to about 8 nm) at such depths (for example, greater than about 80% of fin height FH) reduces parasitic capacitance between subsequently formed source/drain features and gate footing GF, which reduces DIBL and improves short channel control of FinFET device 200 compared to FinFET devices having source/drain recesses with profiles similar to conventional source/drain recesses 250', which have been observed to have proximity footing that is less than 8 nm at depths greater than about 80% of fin height FH. A tapering of bottom segment C" from source/drain tips v1, v2 to target depth TD is also greater than a tapering of a bottom segment from source/drain tips z1, z2 to target depth TD, such that a distance between bottom segment C" of source/drain recesses 250 and gate stacks 230A, 230B is greater than a distance between the bottom segment of convention source/drain recesses 250' and gate stacks 230A, 230B. This increase in distance compared to conventional source/drain recesses 250' can further reduce parasitic capacitance. In some embodiments, the distance between bottom segment C" of source/drain recesses 250 and gate stacks 230A, 230B is greater than or equal to about 6 nm at depths greater than about 50% of fin height FH. When a distance between a bottom segment of source/drain recesses and gate stacks 230A, 230B is less than about 6 nm, such as the distances observed between bottom segment C' of conventional source/drain recesses 250' and gate stacks 230A, 230B, parasitic capacitance between lower portions of subsequently formed source/drain features and subsequently formed metal gates increases, thereby increasing DIBL and degrading short channel control.

Second anisotropic source/drain etch selectively removes fins 222A, 222B with respect to gate spacers 242, fin spacers 244, gate stacks 230A, 230B, and/or isolation feature 225. In other words, second anisotropic source/drain etch substantially removes fins 222A, 222B but does not remove, or does not substantially remove, gate spacers 242, fin spacers 244, gate stacks 230A, 230B, and/or isolation feature 225. Second anisotropic source/drain etch has a vertical etch rate that is greater than a horizontal etch rate (in some embodiments, the horizontal etch rate is zero), such that second anisotropic source/drain etch removes portions of fins 222A, 222B in substantially the vertical direction (here, z-direction) with minimal (to no) removal of material in the horizontal direction (here, x-direction and/or y-direction). For example, second anisotropic source/drain etch has a ratio of VER to HER that is greater than about 20 (e.g., 20≤VER/HER≤80). In some embodiments, second anisotropic source/drain etch is controlled to exhibit a degree of anisotropy that is substantially the same as the degree of anisotropy of first anisotropic source/drain etch. For example, a degree of anisotropy of second anisotropic source/drain etch is about 0.95 to about 1. In some embodiments, second anisotropic source/drain etch is a dry etch process, such as an RIE process, that uses a bromine-containing etch gas to remove the material of fins 222A, 222B (e.g., silicon) at a higher rate than the materials of gate spacers 242 (e.g., silicon nitride), fin spacers 244 (e.g., silicon nitride), gate stacks 230A, 230B (e.g., oxide hard mask or polysilicon), and/or isolation feature 225 (e.g., silicon oxide) (i.e., the etchant has a high etch selectivity with respect to silicon). The bromine-containing etch gas includes Br, HBr, $CH_3Br$, $CH_2Br_2$, $CHBr_3$, other bromine-containing etchant, or combinations thereof. In some embodiments, second anisotropic source/drain etch is configured to generate a bromine-containing plasma from the bromine-containing etch gas, such that second anisotropic source/drain etch removes portions of fins 222A, 222B in S/D regions using plasma-excited bromine-containing species. Second anisotropic source/drain etch can, alternatively or additionally, use a hydrogen-containing etch gas (for example, $H_2$ and/or $CH_4$), a nitrogen-containing etch gas (for example, $N_2$ and/or $NH_3$), a chlorine-containing etch gas (for example, $Cl_2$, $CHCl_3$, $CCl_4$, and/or $BCl_3$), an oxygen-containing etch gas (for example, 02), a fluorine-containing etch gas (for example, $F_2$, $CH_3F$, $CH_2F_2$, $CHF_3$, $CF_4$, $C_2F_6$), an iodine-containing etch gas, other suitable etch gas, or combinations thereof. In some embodiments, a carrier gas is used to deliver the etch gas. The carrier gas may be an inert gas, such as an argon-containing gas, a helium-containing gas, a xenon-containing gas, other suitable inert gas, or combinations thereof.

Various etch parameters of second anisotropic source/drain etch can be tuned to control selective and anisotropic etching of fins 222A, 222B to ensure source/drain recesses 250 reach target depth TD and a profile in the Y-Z plane that resembles a light portion of a candle-shaped light bulb, such as etch gas composition, carrier gas composition, etch gas flow rate, carrier gas flow rate, etch time, etch pressure, etch temperature, source power, RF and/or DC bias voltage, RF and/or DC bias power, other suitable etch parameters, or combinations thereof. In some embodiments, second anisotropic source/drain etch utilizes an etch gas that includes HBr. In such embodiments, a flow rate of HBr may be about 100 sccm to about 200 sccm. In some embodiments, a duration of second anisotropic source/drain etch is about 10 seconds to about 50 seconds. In some embodiments, RF power used for generating a bromine-containing plasma is about 300 W to about 400 W. In some embodiments, a pressure maintained in a process chamber during second anisotropic source/drain etch is about 5 mTorr to about 50 mTorr. In some embodiments, a temperature maintained in the process chamber during second anisotropic source/drain etch is about 20° C. to about 70° C. It is noted that second anisotropic source/drain etch is substantially the same as first anisotropic source/drain etch, except that a duration of second anisotropic source/drain etch is different (in some embodiments, greater) than first anisotropic source/drain etch to ensure source/drain recesses 250 extend to target depth TD after second anisotropic source/drain etch. In some embodiments, second anisotropic source/drain etch utilizes an etch gas that includes $Cl_2$, where a flow rate of $Cl_2$, an etch time, an etch temperature, an etch pressure, and/or an RF power may be tuned to achieve desired etch selectivity and/or desired source/drain recess profile.

In FIG. 3H and FIG. 4H, epitaxial source/drain features 260 are formed in source/drain recesses 250. A first gate structure (including gate stack 230A and gate spacers 242) interposes respective epitaxial source/drain features 260, such that a channel region is defined between the respective epitaxial source/drain features 260. A second gate structure (including gate stack 230B and gate spacers 242) interposes respective epitaxial source/drain features 260, such that a channel region is defined between the respective epitaxial source/drain features 260. In some embodiments, the first gate structure and its respective epitaxial source/drain features 260 form a portion of a first FinFET, and the second gate structure and its respective epitaxial source/drain features 260 form a portion of a second FinFET. In some embodiments, a deposition process is performed to fill source/drain recesses 250 with epitaxial semiconductor material, thereby forming epitaxial source/drain features 260. For example, a semiconductor material is epitaxially grown from portions of fins 222A, 222B and/or substrate 210 defining source/drain recesses 250. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous (for example, Si-containing gases, such as $SiH_4$, and/or Ge-containing gases, such as $GeH_4$) and/or liquid precursors, which interact with the composition of fins 222A, 222B and/or substrate 210. Epitaxial source/drain features 260 are doped with n-type dopants and/or p-type dopants. In some embodiments, epitaxial source/drain features 260 are epitaxial layers including silicon and/or carbon, where the silicon-comprising epitaxial layers or the silicon-carbon-comprising epitaxial layers are doped with phosphorous, other n-type dopant, or combinations thereof. In some embodiments, epitaxial source/drain features 260 are epitaxial layers including silicon and germanium, where the silicon-and-germanium-compromising epitaxial layers are doped with boron, other p-type dopant, or combinations thereof. In some embodiments, epitaxial source/drain features 260 include materials and/or dopants that achieve desired tensile stress and/or compressive stress in the channel regions. In some embodiments, epitaxial source/drain features 260 are doped during deposition by adding impurities to a source material of the epitaxy process. In some embodiments, epitaxial source/drain features 260 are doped by an ion implantation process subsequent to a deposition process. In some embodiments, annealing processes are performed to activate dopants in epitaxial source/drain features 260 and/or other source/drain regions of FinFET device 200 (for example, HDD regions and/or LDD regions).

Epitaxial source/drain features 260 have candle light bulb-shaped profiles in the Y-Z plane. For example, epitaxial source/drain features 260 have a top portion 262A (a portion of epitaxial source/drain features 260 disposed above top surfaces of fins 222A, 222B along the z-direction), a middle portion 262B (a portion of epitaxial source/drain features 260 disposed between top surfaces of fins 222A, 222B and tips T), and a bottom portion 262C (a portion of epitaxial source/drain features 260 disposed between tips T and target depth TD). Top portion 262A resembles a base portion of a candle-shaped light bulb while middle portion 262B and bottom portion 262C combine to resemble a light portion of a candle-shaped light bulb (having, for example, a wide central portion disposed between two narrower end portions), which is configured to resemble a flame of a candle. In the depicted embodiment, top portion 262A has a width wt that is substantially the same along its thickness tt, middle portion 262B has a width wm that increases along its thickness tm from top surfaces of fins 222A, 222B to tips T (i.e., an outwardly tapering width along fin height FH towards target depth TD), and bottom portion 262C has a width wb that decreases along its thickness tb from tips T to target depth TD (i.e., an inwardly tapering width along fin height FH toward target depth TD). A maximum width of epitaxial source/drain features 260 is defined between tips T. In some embodiments, maximum width is about 20 nm to about 35 nm. In some embodiments, as depicted, width wt is substantially equal to spacing S between gate spacers 242, such that top portion 262A physically contacts outer sidewalls OSs of gate spacers 242. In some embodiments, width wt is less than spacing S, such that top portion 262A does not physically contact or only partially physically contacts outer sidewalls OSs of gate spacers 242. In furtherance of the depicted embodiment, bottom portion 262C is defined by a V-shaped blunt tip, such that bottom portion 262C forms a blunt bottom tip of epitaxial source/drain features 260. In the X-Z plane, epitaxial source/drain features 260 have a top portion 264A (a portion of epitaxial source/drain features 260 disposed above top surfaces of fins 222A, 222B along the z-direction) and a bottom portion 264B (a portion of epitaxial source/drain features 260 disposed below top surfaces of fins 222A, 222B along the z-direction). In the depicted embodiment, top portion 264A has a width wt1 that varies along its thickness tt and bottom portion 264B has a width wb1 that varies along its thickness, which is substantially equal to depth d5 (i.e., target depth TD). In some embodiments, width wt1 of at least a portion of top portion 264A is greater than a width of fins 222A, 222B. In some embodiments, top portion 264A has a wide central portion with narrower end portions. In some embodiments, top portion 264A has a substantially diamond-shaped profile. In some embodiments, top portion 264A has a substantially hexagonal-shaped profile. In some embodiments, width wb1 of a first portion of bottom portion 264B is substantially the same as a width of fins 222A, 222B and width b1 of a second portion of bottom portion 264B decreases along the z-direction towards target depth TD.

Because of the three-step source/drain recess etch process described herein, epitaxial source/drain features 260 have tips T that are closer to top surfaces of fins 222A, 222B than can be achieved with conventional source/drain fabrication processes. For example, tips T have tip depth dt and tip proximity pt, advantages of which are described in detail herein. Epitaxial source/drain features 260 further have proximity footing pf that is greater than can be achieved with conventional source/drain fabrication processes, advantages of which are described in detail herein. In contrast to conventional source/drain fabrication processes, which define a location of tips after extending source/drain recesses to target depth TD, the proposed three-step source/drain recess etch process defines a location of tips T before extending source/drain recesses to target depth TD. Such fabrication technique raises the location of the tips T to locations that reduce parasitic resistance between epitaxial source/drain features 260 and subsequently formed metal gate while pulling back (in other words, increasing) proximity of a bottom portion of epitaxial source/drain features 260 to the subsequently formed metal gate (in particular, proximity footing pf), which reduces parasitic capacitance between epitaxial source/drain features 260 and the metal gate. Accordingly, epitaxial source/drain features 260 having the proposed candle light bulb-shaped profiles reduce DIBL, thereby improving short channel control of FinFET device 200. Further, the three-step source/drain etch process enables controlling (adjusting) a position (location) of tips T to about 10% of fin height FH to about 80% of fin height FH while pulling back bottom proximity of epitaxial source/drain features 260. For example, as depicted in FIG. 5, whether depth dt of source/drain tips v1, v2 is about 10% of fin height FH (corresponding with source/drain recess 250-1 in FIG. 5) or about 80% of fin height FH (corresponding with source/drain recess 250-2 in FIG. 5), the three-step source/drain recess etch process produces proximity footing pf that is less than proximity footing pf' at depths greater than or equal to about 80% of fin height FH, at which depths gate footing GF and corresponding capacitive coupling effects are most prevalent. Different embodiments may have different advantages, and no particular advantage is required of any embodiment.

Turning to FIG. 6, channel resistance and DIBL characteristics of FinFET devices having epitaxial source/drain features with various profiles are illustrated according to various aspects of the present disclosure. In FIG. 6, a graph 300 illustrates trade-offs between DIBL and channel resistance (Rch). For example, graph 300 correlates DIBL (in mV/V) (x-axis) with Rch (in ohms) (y-axis), where curve xx corresponds with FinFET devices having epitaxial source/drain features fabricated using conventional source/drain recess techniques and curve xy corresponds with FinFET devices having epitaxial source/drain features fabricated using the proposed three-step source/drain etch process. Both curve xx and curve xy indicate that as channel resistance decreases, for example, from pushing tip proximity closer to channel regions of the FinFET devices, DIBL increases, for example, from bottom portions of the epitaxial source/drain features pulling in closer to the channel regions of the FinFET devices as a result of the tip proximity push (thus leading to decreasing distances between the bottom portions of the epitaxial source/drain features and gate footing GF). In curve xx, R1 corresponds with channel resistance and DIBL characteristics of FinFET devices with epitaxial source/drain features having profiles achieved by an anisotropic etch that extends source/drain recesses to target depth TD (for example, substantially U-shaped profiles), and R2 corresponds with channel resistance and DIBL characteristics of FinFET devices with epitaxial source/drain features having profiles achieved by an anisotropic etch that extends source/drain recesses to target depth followed by an isotropic etch to decrease tip proximity (and thus increase a width) of the source/drain recesses, such as those defined by conventional source/drain recesses 250' depicted in FIG. 3H. As seen in FIG. 6, though conventional source/drain recesses 250' achieve FinFET devices that exhibit less channel resistance, conventional source/drain recesses 250' increase DIBL significantly because bottom portions of conventional source/drain recesses 250' (in particular, the bottom tapered portions) are also pushed closer to the channel region during the isotropic etch. In curve xy, R3 corresponds with channel resistance and DIBL characteristics of FinFET devices with epitaxial source/drain features having profiles defined by the proposed three-step source/drain recess etch process, such as those defined by source/drain recesses 250. As seen in FIG. 6, source/drain recesses 250 achieve FinFET devices having lower channel resistances comparable to those achieved by conventional source/drain recesses 250', but also recover DIBL increases suffered by FinFET devices with conventional source/drain recesses 250'. FinFET devices having epitaxial source/drain features with profiles defined by source/drain recesses 250 thus exhibit reduced channel resistance and reduced DIBL compared to conventional FinFET devices, providing FinFET devices with better short channel control.

In some embodiments, as depicted in FIG. 7, epitaxial source/drain features 260 have a multi-layer structure, such as a first epitaxial semiconductor layer 260-1 disposed over a second epitaxial semiconductor layer 260-2. First epitaxial semiconductor layer 260-1 and second epitaxial semiconductor layer 260-2 include at least one constituent that is the same, where a concentration of the constituent in first epitaxial semiconductor layer 260-1 is greater than a concentration of the constituent in second epitaxial semiconductor layer 260-2 to enhance conductivity and reduce resistance between epitaxial source/drain features 260 and subsequently formed contacts. For example, first epitaxial semiconductor layer 260-1 and second epitaxial semiconductor layer 260-2 each include silicon germanium, where a germanium concentration in first epitaxial semiconductor layer 260-1 is greater than a germanium concentration in second epitaxial semiconductor layer 260-2. In some embodiments, a germanium concentration in first epitaxial semiconductor layer 260-1 is about 40% to about 60% and a germanium concentration in second epitaxial semiconductor layer 260-2 is about 20% to about 40%. In another example, first epitaxial semiconductor layer 260-1 and second epitaxial semiconductor layer 260-2 include the same material (for example, silicon or silicon germanium), where a dopant concentration of a dopant in first epitaxial semiconductor layer 260-1 (e.g., a dopant concentration of phosphorous or boron) is greater than a dopant concentration of the dopant in second epitaxial semiconductor layer 260-2. In some embodiments, where first epitaxial semiconductor layer 260-1 and second epitaxial semiconductor layer 260-2 include silicon, a phosphorous dopant concentration in first epitaxial semiconductor layer 260-1 is about $1 \times 10^{21}$ cm$^{-3}$ to about $5 \times 10^{21}$ cm$^{-3}$ and a phosphorous dopant concentration in second epitaxial semiconductor layer 260-2 is about $1 \times 10^{20}$ cm$^{-3}$ to about $1 \times 10^{21}$ cm$^{-3}$. In some embodiments, where first epitaxial semiconductor layer 260-1 and second epitaxial semiconductor layer 260-2 include silicon germanium, a boron dopant concentration in first epitaxial semiconductor layer 260-1 is about $5 \times 10^{20}$ cm$^{-3}$ to about $1 \times 10^{21}$ cm$^{-3}$ and a boron dopant concentration in second epitaxial semiconductor layer 260-2 is about $1 \times 10^{20}$ cm$^{-3}$ to about $5 \times 10^{20}$ cm$^{-3}$. In some embodiments, second epitaxial semiconductor layer 260-2 is a buffer layer configured to reduce lattice mismatch between fins 222A, 222B and epitaxial source/drain features 260. In such embodiments, a concentration of a constituent may be graded in second epitaxial semiconductor layer 260-2 from fins 222A, 222B to first epitaxial semiconductor layer 260-1.

Figure 4I:
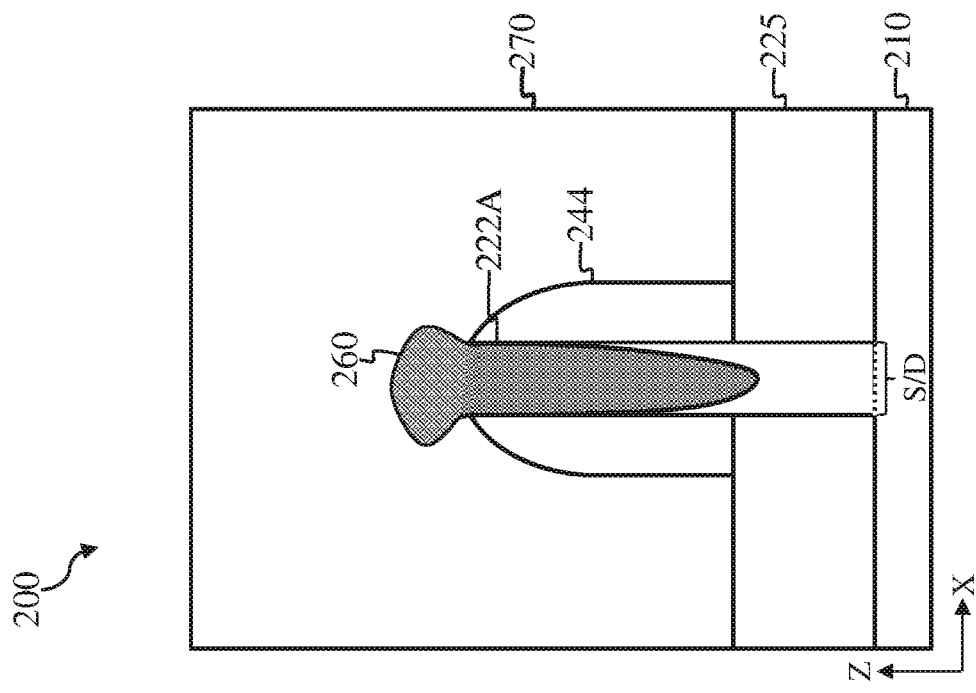
Figure 3I:
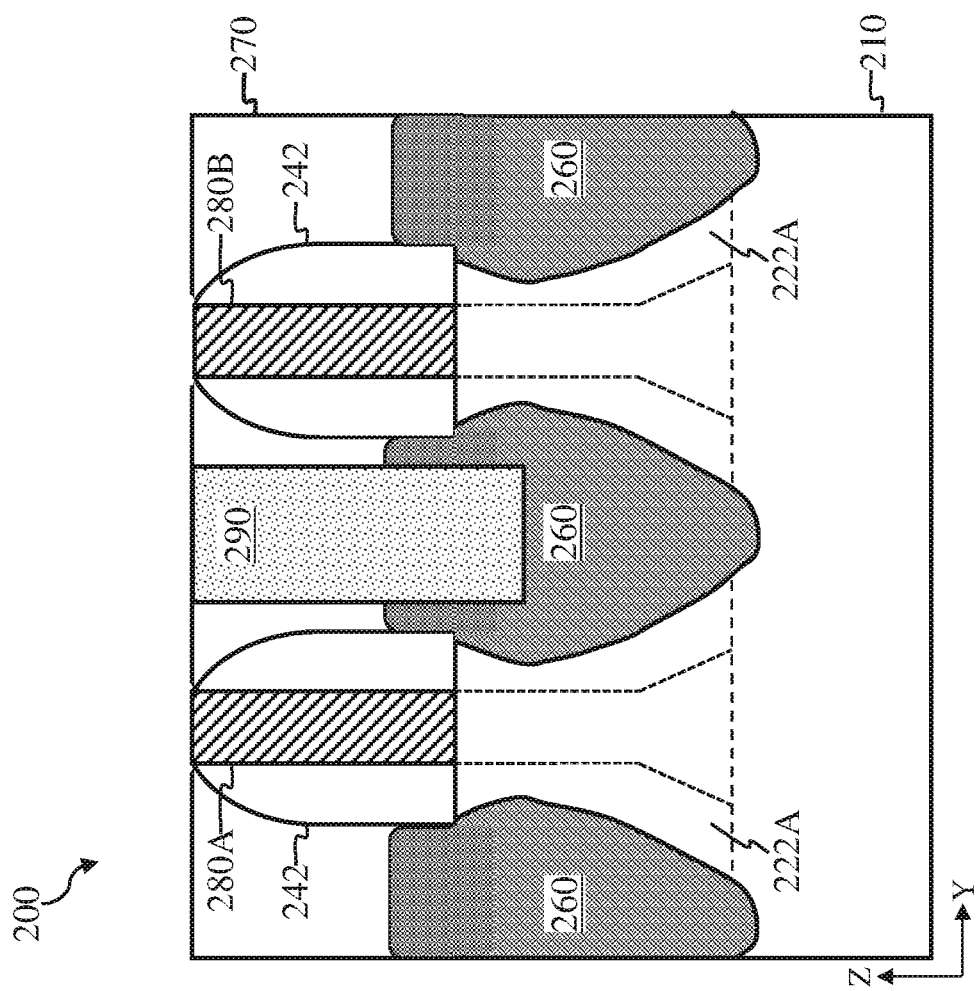

Turning to FIG. 3I and FIG. 4I, FinFET device 200 can undergo additional processing. For example, a dielectric layer 270 is formed over fins 222A, 222B, gate stacks 230A, 230B, gate spacers 242, fin spacers 244, and epitaxial source/drain features 260. Dielectric layer 270 forms a portion of a multi-layer interconnect (MLI) feature, in some embodiments. Dielectric layer 270 can include an interlayer dielectric (ILD) layer disposed over a contact etch stop layer (CESL). ILD layer includes a dielectric material including, for example, silicon oxide, carbon doped silicon oxide, silicon nitride, silicon oxynitride, tetraethyl orthosilicate (TEOS), PSG, BSG, boron-doped phosphosilicate glass (BPSG), fluorine-doped silicate glass (FSG), Black Diamond® (Applied Materials of Santa Clara, Calif.), xerogel, aerogel, amorphous fluorinated carbon, parylene, benzocyclobutene (BCB)-based dielectric material, SiLK (Dow Chemical, Midland, Mich.), polyimide, other suitable dielectric material, or combinations thereof. In some embodiments, ILD layer includes a low-k dielectric material, which generally refers to a dielectric material having a low dielectric constant relative to the dielectric constant of silicon dioxide (k≈3.9). For example, low-k dielectric material has a dielectric constant less than about 3.9. In some embodiments, the low-k dielectric material has a dielectric constant less than about 2.5, which can be referred to as an extreme low-k (ELK) dielectric material. In the depicted embodiment, ILD layer includes a low-k dielectric material. CESL includes a material different than ILD layer, such as a dielectric material that is different than the dielectric material of ILD layer. ILD layer and/or CESL can include a multilayer structure having multiple dielectric materials. In the depicted embodiment, where ILD layer includes silicon and oxygen (for example, SiCOH, SiO$_x$, or other silicon-and-oxygen comprising material), CESL includes nitrogen and/or carbon (for example, SiN, SiCN, SiCON, SiON, SiC, SiCO, metal nitride, and/or metal carbonitride). ILD layer and/or CESL are formed by a deposition process, such as CVD, PVD, ALD, HDPCVD, MOCVD, RPCVD, PECVD, LPCVD, ALCVD, APCVD, PEALD, other suitable methods, or combinations thereof. In some embodiments, ILD layer are formed by a flowable CVD (FCVD) process that includes, for example, depositing a flowable material (such as a liquid compound) over substrate 210 and converting the flowable material to a solid material by a suitable technique, such as thermal annealing and/or treating the flowable material with ultraviolet radiation. Subsequent to the deposition of ILD layer and/or CESL, a CMP process and/or other planarization process is performed, such that ILD layer and/or CESL have substantially planar surfaces.

In some embodiments, after forming dielectric layer 270, gate stacks 230A, 230B are replaced with metal gate stacks 280A, 280B using any suitable gate replacement process, which includes various etching processes, deposition processes, lithography processes, and/or planarization processes. For example, gate stacks 230A, 230B are partially or fully removed (e.g., a dummy gate electrode layer, and in some embodiments, a dummy gate dielectric layer) is removed to form gate trenches (openings) that expose fin structures 222A, 222B, an interfacial layer, and/or gate dielectric layer and metal gate stacks 280A, 280B are formed in the gate trenches. Metal gate stacks 280A, 280B are configured to achieve desired functionality according to design requirements of FinFET device 200, such that metal gate stack 280A may include the same or different layers and/or materials as metal gate stack 280B. In some embodiments, metal gate stacks 280A, 280B include a gate dielectric (for example, a gate dielectric layer) and a gate electrode (for example, a work function layer and a bulk conductive layer). Metal gate stacks 280A, 280B may include numerous other layers, for example, capping layers, interface layers, diffusion layers, barrier layers, hard mask layers, or combinations thereof. In some embodiments, the gate dielectric layer is disposed over an interfacial layer (including a dielectric material, such as silicon oxide), and the gate electrode is disposed over the gate dielectric layer. The gate dielectric layer includes a dielectric material, such as silicon oxide, high-k dielectric material, other suitable dielectric material, or combinations thereof. Examples of high-k dielectric material include hafnium dioxide (HfO$_2$), HfSiO, HfSiON, HfTaO, HfSiO, HfZrO, zirconium oxide, aluminum oxide, hafnium dioxide-alumina (HfO$_2$—Al$_2$O$_3$) alloy, other suitable high-k dielectric materials, or combinations thereof. High-k dielectric material generally refers to dielectric materials having a high dielectric constant relative to a dielectric constant of silicon dioxide (k≈3.9). For example, high-k dielectric material has a dielectric constant greater than about 3.9. In some embodiments, the gate dielectric layer is a high-k dielectric layer. The gate electrode includes a conductive material, such as polysilicon, Al, Cu, Ti, Ta, W, Mo, Co, TaN, NiSi, CoSi, TiN, WN, TiAl, TiAlN, TaCN, TaC, TaSiN, other conductive material, or combinations thereof. In some embodiments, the work function layer is a conductive layer tuned to have a desired work function (e.g., an n-type work function or a p-type work function), and the conductive bulk layer is a conductive layer formed over the work function layer. In some embodiments, the work function layer includes n-type work function materials, such as Ti, Ag, Mn, Zr, TaAl, TaAlC, TiAlN, TaC, TaCN, TaSiN, other suitable n-type work function materials, or combinations thereof. In some embodiments, the work function layer includes a p-type work function material, such as Ru, Mo, Al, TiN, TaN, WN, $ZrSi_2$, $MoSi_2$, $TaSi_2$, $NiSi_2$, WN, other suitable p-type work function materials, or combinations thereof. The bulk (or fill) conductive layer includes a suitable conductive material, such as Al, W, and/or Cu. The bulk conductive layer may additionally or collectively include polysilicon, Ti, Ta, metal alloys, other suitable materials, or combinations thereof.

In some embodiments, various interconnects of the MLI feature are formed to facilitate operation of FinFET device 200. MLI feature electrically couples various devices (for example, transistors, resistors, capacitors, and/or inductors) and/or components (for example, gate structures and/or source/drain features) of FinFET device 200, such that the various devices and/or components can operate as specified by design requirements of FinFET device. MLI feature includes a combination of dielectric layers, such as dielectric layer 270, and conductive layers configured to form various interconnects. During operation of FinFET device 200, the interconnects are configured to route signals between the devices and/or the components of FinFET device 200 and/or distribute signals (for example, clock signals, voltage signals, and/or ground signals) to the devices and/or the components of FinFET device 200. The conductive layers are configured to form vertical interconnects, such as device-level contacts and/or vias, and/or horizontal interconnects, such as conductive lines. Vertical interconnects typically connect horizontal interconnects in different layers (or different planes) of MLI feature. Device-level contacts (also referred to as local interconnects or local contacts) electrically couple and/or physically couple IC device features to other conductive features of the MLI feature, such as vias. Device-level contacts include metal-to-poly (MP) contacts, which generally refer to contacts to a gate structure, such as a poly gate structure or a metal gate structure, and metal-to-device (MD) contacts, which generally refer to contacts to a conductive region of FinFET device 200, such as epitaxial source/drain features 260. In FIG. 3I, an MD contact, such as source/drain contact 290, extends through dielectric layer 270 to a respective epitaxial source/drain feature 260. Source/drain contact 290 includes a conductive material, such as metal. Metals include aluminum, aluminum alloy (such as aluminum/silicon/copper alloy), copper, copper alloy, titanium, titanium nitride, tantalum, tantalum alloy, tantalum nitride, tungsten, tungsten alloy, cobalt, cobalt alloy, ruthenium, ruthenium alloy, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, a damascene process and/or dual damascene process is used to form a copper-based MLI feature.

In embodiments where epitaxial source/drain features 260 include a multi-layer structure, such as depicted in FIG. 7, the candle light bulb-shaped profile of epitaxial source/drain features 260 provides additional advantages. In some embodiments, source/drain contact 290 has a critical dimension D1 (e.g., a width along the y-direction or gate length direction) and epitaxial source/drain features 260 have a critical dimension D2 (e.g., a minimum width of first epitaxial semiconductor layer 260-1 in middle portion 262B of epitaxial source/drain feature 260). Because three-step source/drain etch process increases a width of source/drain recesses and defines a location of tips T before extending the source/drain recesses to target depth DT, source/drain recesses 250 are wider than conventional source/drain recesses 250' at depths less than about 40% of fin height FH. Critical dimension D2 of epitaxial source/drain features 260 is thus greater than critical dimension D3 (e.g., a minimum width of a first epitaxial semiconductor layer in a middle portion) of epitaxial source/drain features having profiles defined by conventional source/drain recesses 250', which reduces resistance between epitaxial source/drain features 260 and source/drain contact 290. In some embodiments, critical dimension D2 is greater than critical dimension D1, whereas critical dimension D3 is substantially the same as critical dimension D1. In some embodiments, critical dimension D2 is greater than critical dimension D1 by at least 5 nm. In some embodiments, a distance between sidewalls of source/drain contact 290 and portions of first epitaxial semiconductor layer 260-1 defining critical dimension D2 is greater than or equal to about 2 nm. In some embodiments, in contrast to epitaxial source/drain features having profiles defined by conventional source/drain recesses 250', epitaxial first semiconductor layer 260-1 in middle portion 262B of epitaxial source/drain features 260 does not extend beyond outer sidewalls OSs of gate spacers 242.

The present disclosure provides for various source and drain formation techniques for fin-like field effect transistors (FinFETs). Source and drain formation techniques disclosed herein provide FinFETs with reduced channel resistance and reduced drain-induced barrier lowering. An exemplary three-step etch method for forming a source/drain recess in a source/drain region of a fin includes a first anisotropic etch, an isotropic etch, and a second anisotropic etch. The first anisotropic etch and the isotropic etch are tuned to define a location of a source/drain tip. A depth of the source/drain recess after the first anisotropic etch and the isotropic etch is less than a target depth. The second anisotropic etch is tuned to extend the depth of the source/drain recess to the target depth. The source/drain tip is near a top of the fin to reduce channel resistance while a bottom portion of the source/drain recess is spaced a distance from a gate footing that can minimize DIBL. The source/drain recess is filled with an epitaxial semiconductor material. In some embodiments, the first anisotropic etch process and the second anisotropic etch process implement a same etching gas. A first duration of the first anisotropic etch process may be different than a second duration of the second anisotropic etch process. In some embodiments, the first anisotropic etch process, the isotropic etch process, and the second anisotropic etch process are selective dry etch processes. In some embodiments, the first anisotropic etch process and the second anisotropic etch process implement a hydrogen-and-bromine-containing etch gas and the isotropic etch process implements a fluorineand-chlorine-containing etch gas. In some embodiments, filling the source/drain recess with the epitaxial semiconductor material includes forming a first epitaxial semiconductor layer along surfaces of the fin defining the source/drain recess and forming a second epitaxial semiconductor layer over the first epitaxial semiconductor layer. The first epitaxial semiconductor layer has a first concentration of a constituent and the second epitaxial semiconductor layer has a second concentration of the constituent that is greater than the first concentration.

In some embodiment, the method further includes performing a third anisotropic etch process to form gate spacers. The third anisotropic etch process may begin formation of the source/drain recess. In some embodiments, the method includes tuning first parameters of the first anisotropic etch process and second parameters of the isotropic etch process to define the location of a source/drain tip and tuning third parameters of the second anisotropic etch process to extend the depth of the source/drain recess to the target depth. In some embodiments, the first parameters of the first anisotropic etch process are tuned to provide the source/drain recess with a U-shaped profile, the second parameters of the isotropic etch process are tuned to provide the source/drain recess with a bowl-shaped profile, and the third parameters of the second anisotropic etch process are tuned to provide the source/drain recess with a profile that resembles a light portion of a candle-shaped light bulb.

Another exemplary method includes forming a gate stack over a channel region of a fin and forming gate spacers along sidewalls of the gate stack. The channel region of the fin is disposed between source/drain regions of the fin. The method further includes performing a first etching process to form source/drain recesses in the source/drain regions of the fin. The source/drain recesses have a first width and a first depth, and the first depth is less than a target depth for the source/drain recesses. The method further includes performing a second etching process to increase the first width of the source/drain recesses to a second width and performing a third etching process to increase the first depth of the source/drain recesses to the target depth. The method further includes forming semiconductor source/drain features in the source/drain recesses. In some embodiments, performing the first etching process and the third etching process includes removing fin material in substantially a vertical direction and performing the second etching process includes removing the fin material in substantially the vertical direction and substantially a horizontal direction. In some embodiments, the fin has a fin height, the first depth is equal to about 10% to about 80% of the fin height, and the target depth is equal to about 80% to about 120% of the fin height.

In some embodiments, performing the first etching process and the performing the second etching process includes controlling a tip depth and a tip proximity of the source/drain recesses along a fin height of the fin. In some embodiments, the fin has a fin height, each of the gate spacers has a gate spacer thickness, the first depth is less than about 50% of the fin height, the tip depth is about 10% of the fin height to about 30% of the fin height, and the tip proximity is about 60% of the gate spacer thickness to about 90% of the gate spacer thickness. In some embodiments, forming the gate spacers along the sidewalls of the gate stack includes forming a spacer layer over the gate stack and the source/drain regions of the fin, performing a first spacer etch, and performing a second spacer etch. The first spacer etch and the second spacer etch remove a portion of the spacer layer and begin formation of the source/drain recesses. The source/drain recesses have a second depth after the first spacer etch and a third depth after the second spacer etch. The second depth and the third depth are less than the first depth. In some embodiments, the fin has a fin height, the second depth is less than about 10% of the fin height, the third depth is about 10% to about 20% of the fin height, the first depth is about 10% to about 80% of the fin height, and the target depth is about 80% to about 120% of the fin height.

An exemplary device includes a fin having a fin height, a gate stack disposed over a channel region of the fin, a gate spacer disposed along a sidewall of the gate stack, and an epitaxial source/drain feature disposed in a source/drain region of the fin. The gate spacer has a gate spacer thickness. The epitaxial source/drain feature has a candle light bulb-shaped cross-sectional profile, such that the epitaxial source/drain feature includes a top portion disposed over a top surface of the fin, a middle portion disposed between the top surface of the fin and tips of the epitaxial source/drain feature, and a bottom portion disposed between the top surface of the fin and a depth of the epitaxial source/drain feature in the fin. A tip depth of the tips of the epitaxial source/drain feature is about 10% of the fin height to about 30% of the fin height. A proximity footing of the bottom portion of the epitaxial source/drain feature is greater than about 8 nm at depths greater than about 80% of the fin height. In some embodiments, a tip proximity of the tips of the epitaxial source/drain feature is about 60% of the gate spacer thickness to about 90% of the gate spacer thickness. In some embodiments, a first width of the top portion is substantially the same along a first thickness of the top portion, a second width of the middle portion increases along a second thickness of the middle portion, and a third width of the bottom portion decreases along a third thickness of the bottom portion. The first thickness, the second thickness, and the third thickness extend substantially parallel to a fin height direction. The third thickness may be greater than the second thickness and greater than the first thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a semiconductor structure that extends from a substrate along a first direction, wherein the semiconductor structure has a height along the first direction and the semiconductor structure extends lengthwise along a second direction that is different than the first direction;
    forming a gate stack over a first region of the semiconductor structure, wherein the gate stack extends lengthwise along a third direction that is different than the second direction;
    forming a spacer layer over the gate stack and a second region of the semiconductor structure, wherein the second region is adjacent to the first region;
    performing a first etch and a second etch on the spacer layer to form gate spacers along sidewalls of the gate stack, wherein the first etch further forms a trench having a first depth along the first direction in the second region of the semiconductor structure and the second etch extends the trench from the first depth to a second depth;
performing a third etch to extend the trench from the second depth to a third depth;
performing a fourth etch that enlarges the trench along the second direction, wherein the fourth etch extends the trench under one of the gate spacers;
performing a fifth etch to extend the trench to a fourth depth; and
forming an epitaxial semiconductor structure in the trench in the second region of the semiconductor structure.

2. The method of claim 1, wherein the first depth is less than 10% of the height, the second depth is less than 20% of the height, the third depth is about 10% to about 80% of the height, and the fourth depth is about 80% to about 120% of the height.

3. The method of claim 1, further comprising tuning parameters of the third etch, the fourth etch, and the fifth etch to configure the trench, such that the epitaxial semiconductor structure has a candle light bulb-shaped cross-sectional profile provided by:
a top portion over a top surface of the semiconductor structure;
a middle portion between the top surface of the semiconductor structure and tips of the epitaxial semiconductor structure; and
a bottom portion between the top surface of the semiconductor structure and a depth of the epitaxial semiconductor structure in the semiconductor structure, wherein the depth of the epitaxial semiconductor structure is equal to the fourth depth, a tip depth of the tips of the epitaxial semiconductor structure is about 10% of the height to about 40% of the height, and a proximity footing of the bottom portion of the epitaxial semiconductor structure is greater than about 8 nm at depths greater than about 80% of the height.

4. The method of claim 1, wherein:
the spacer layer includes silicon and nitrogen;
the first etch implements a fluorine-containing etch gas; and
the second etch implements a fluorine-and-hydrogen-containing etch gas.

5. The method of claim 4, wherein:
the first etch generates a fluorine-containing plasma by implementing a flow rate of $CF_4$ of about 200 sccm to about 300 sccm, an RF power of about 400 W to about 500 W, and a pressure of about 10 mTorr to about 50 mTorr; and
the second etch generates a hydrogen-and-fluorine containing plasma by implementing a flow rate of $CH_3F$ of about 100 sccm to about 200 sccm, a flow rate of $O_2$ of about 50 sccm to about 150 sccm, an RF power of about 400 W to about 500 W, and a pressure of about 10 mTorr to about 50 mTorr.

6. The method of claim 1, wherein:
the third etch implement a first hydrogen-and-bromine-containing etch gas;
the fourth etch implements a fluorine-and-chlorine-containing etch gas; and
the fifth etch implements a second hydrogen-and-bromine-containing etch gas.

7. The method of claim 6, wherein:
the third etch and the fifth etch each generate a bromine-containing plasma by implementing a flow rate of HBr of about 100 sccm to about 200 sccm, an RF power of about 300 W to about 400 W, and a pressure of about 5 mTorr to about 30 mTorr, wherein a duration of the third etch is greater than a duration of the fifth etch; and
the fourth etch generates a fluorine-and-oxygen containing plasma by implementing a flow rate of $NF_3$ of about 100 sccm to about 300 sccm, a flow rate of $Cl_2$ of about 100 sccm to about 200 sccm, an RF power of about 300 W to about 400 W, and a pressure of about 5 mTorr to about 50 mTorr.

8. The method of claim 1, wherein a degree of anisotropy of the third etch and the fifth etch is about 0.95 to about 1 and a degree of anisotropy of the fourth etch is about 0.8.

9. The method of claim 1, wherein:
the forming the epitaxial semiconductor structure in the trench includes forming a first epitaxial semiconductor layer and a second epitaxial semiconductor layer, wherein the second epitaxial semiconductor layer is disposed over the first epitaxial semiconductor layer; and
the method further includes forming a source/drain contact that extends into the epitaxial semiconductor structure, wherein the second epitaxial semiconductor layer is disposed between sidewalls of the source/drain contact and the first epitaxial semiconductor layer.

10. A method comprising:
forming a fin that extends from a substrate, wherein the fin has a fin height;
forming a gate stack over a channel region of the fin;
forming a gate spacer along a sidewall of the gate stack; and
forming an epitaxial source/drain feature in a source/drain region of the fin, wherein the epitaxial source/drain feature has a candle light bulb-shaped cross-sectional profile, such that the epitaxial source/drain feature includes:
a top portion disposed over a top surface of the fin,
a middle portion disposed between the top surface of the fin and tips of the epitaxial source/drain feature, and
a bottom portion disposed between the tips of the epitaxial source/drain feature and a depth of the epitaxial source/drain feature in the fin, wherein:
a tip depth of the tips of the epitaxial source/drain feature is about 10% of the fin height to about 40% of the fin height; and
a proximity footing of the bottom portion of the epitaxial source/drain feature is greater than about 8 nm at depths greater than about 80% of the fin height.

11. The method of claim 10, wherein the gate spacer has a gate spacer thickness and the forming the epitaxial source/drain feature includes configuring parameters of etch processes to provide a tip proximity of the tips of the epitaxial source/drain feature that is about 50% of the gate spacer thickness to about 90% of the gate spacer thickness.

12. The method of claim 10, wherein the forming the epitaxial source/drain feature includes configuring parameters of etch processes to provide the top portion with a first width that is substantially the same along a first thickness of the top portion, the middle portion with a second width that increases along a second thickness of the middle portion, and the bottom portion with a third width that decreases along a third thickness of the bottom portion, wherein the first thickness, the second thickness, and the third thickness extend substantially parallel to a fin height direction.

13. The method of claim 12, wherein the third thickness is greater than the second thickness and greater than the first thickness.

14. The method of claim 10, further comprising forming a source/drain contact that extends through the top portion and into the middle portion.

15. The method of claim 14, wherein the forming the epitaxial source/drain feature in the source/drain region of the fin includes forming a first epitaxial layer and a second epitaxial layer, wherein:
the middle portion of the epitaxial source/drain feature includes the first epitaxial layer and the second epitaxial layer; and
the first epitaxial layer is disposed between sidewalls of the source/drain contact and the second epitaxial layer.

16. The method of claim 15, wherein a thickness of the first epitaxial layer disposed between the sidewalls of the source/drain contact and the second epitaxial layer is greater than or equal to about 2 nm.

17. A device comprising:
a semiconductor structure extending from a substrate along a first direction, wherein the semiconductor structure has a height along the first direction and the semiconductor structure extends lengthwise along a second direction that is different than the first direction;
a gate structure disposed over a first region of the semiconductor structure, wherein the gate structure extends lengthwise along a third direction, the third direction is different than the second direction, and the gate structure includes a gate stack and gate spacers disposed along sidewalls of the gate stack;
a first epitaxial semiconductor structure and a second epitaxial semiconductor structure disposed in a second region and a third region, respectively, of the semiconductor structure, wherein the gate structure is disposed between the first epitaxial semiconductor structure and the second epitaxial semiconductor structure along the second direction, the first epitaxial semiconductor structure and the second epitaxial semiconductor structure each include a first epitaxial layer disposed over a second epitaxial layer, the first epitaxial semiconductor structure and the second epitaxial semiconductor structure each extend a depth into the semiconductor structure along the first direction, and the first epitaxial semiconductor structure and the second epitaxial semiconductor structure each include:
a top portion disposed over a top surface of the semiconductor structure,
a middle portion disposed between the top surface of the semiconductor structure and tips of the first epitaxial semiconductor structure and the second epitaxial semiconductor structure, respectively, and
a bottom portion disposed between the tips of the first epitaxial semiconductor structure and the second epitaxial semiconductor structure, respectively, and the depth of the first epitaxial semiconductor structure and the second epitaxial semiconductor structure, wherein:
a tip depth of the tips of the first epitaxial semiconductor structure and the second epitaxial semiconductor structure is about 10% of the height to about 40% of the height; and
a proximity footing of the bottom portion of the first epitaxial semiconductor structure and the second epitaxial semiconductor structure is greater than about 8 nm at depths greater than about 80% of the height; and
a metal contact to the second epitaxial semiconductor structure, wherein the first epitaxial layer of the second epitaxial semiconductor structure is disposed between sidewalls of the metal contact and the second epitaxial layer of the second epitaxial semiconductor structure.

18. The device of claim 17, wherein the first epitaxial layer and the second epitaxial layer each have a constituent and a first concentration of the constituent in the first epitaxial layer is greater than a second concentration of the constituent in the second epitaxial layer.

19. The device of claim 17, wherein the metal contact has a dimension along the second direction, a width of the first epitaxial layer in the middle portion of the second epitaxial semiconductor structure is along the second direction, and the width is at least 5 nm greater than the dimension.

20. The device of claim 17, wherein a distance along the second direction between sidewalls of the metal contact and the second epitaxial layer of the second epitaxial semiconductor structure is greater than about 2 nm.

* * * * *